US012765425B2

(12) United States Patent
Sato et al.

(10) Patent No.: US 12,765,425 B2
(45) Date of Patent: Oct. 13, 2026

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Yuki Sato, Fujisawa Kanagawa (JP); Tsukasa Konno, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 397 days.

(21) Appl. No.: 18/463,792

(22) Filed: Sep. 8, 2023

(65) Prior Publication Data

US 2024/0194647 A1 Jun. 13, 2024

(30) Foreign Application Priority Data

Dec. 12, 2022 (JP) ................................ 2022-197857

(51) Int. Cl.

| | |
|---|---|
| ***H10W 90/00*** | (2026.01) |
| ***H10P 72/70*** | (2026.01) |
| ***H10W 76/60*** | (2026.01) |

(52) U.S. Cl.

CPC ......... *H10W 90/00* (2026.01); *H10P 72/7402* (2026.01); *H10W 76/60* (2026.01); *H10W 90/701* (2026.01); *H10W 90/752* (2026.01)

(58) Field of Classification Search

CPC ... H10W 90/00; H10W 76/60; H10W 90/701; H10W 90/752; H10W 70/611; H10W 70/65; H10W 72/354; H10W 20/0698; H10W 72/071; H10W 74/01; H10W 74/129; H10P 72/7402; H01L 25/18; H01L 25/50; H01L 2224/8385; H01L 2225/06506; H01L 2225/0651; H01L 2225/06562; H01L 25/0657; H10B 80/00

USPC .......................................................... 257/678

See application file for complete search history.

(56) References Cited

U.S. PATENT DOCUMENTS

| | | | | |
|---|---|---|---|---|
| 7,875,499 B2 | 1/2011 | Yamano | | |
| 2009/0085222 A1* | 4/2009 | Yamano | ................ | H01L 25/105 257/E23.116 |
| 2010/0022035 A1 | 1/2010 | Yamano | | |

(Continued)

FOREIGN PATENT DOCUMENTS

| | | |
|---|---|---|
| JP | 2019057575 A | 4/2019 |
| TW | 200915533 A | 4/2009 |

*Primary Examiner* — Theresa T Doan

(74) *Attorney, Agent, or Firm* — Maier & Maier, PLLC

(57) ABSTRACT

A semiconductor device includes: a substrate; a first semiconductor chip; a first bonding pad; a second semiconductor chip arranged between the substrate and the first semiconductor chip; a second bonding pad; a first insulating film; a bonding wire that connects the substrate, the first bonding pad, and the second bonding pad; and a sealing resin that seals at least the first semiconductor chip, the second semiconductor chip, and the bonding wire. The second semiconductor chip includes a first surface that faces the substrate, and a second opposite surface. The second surface includes a first bonding region where the second bonding pad and the first insulating film are arranged, and a first lamination region that has a first low-level surface formed lower than a surface of the first insulating film, the first semiconductor chip arranged on or above at least a part of the first low-level surface.

6 Claims, 27 Drawing Sheets

(56) References Cited

U.S. PATENT DOCUMENTS

| | | | |
|---|---|---|---|
| 2019/0088624 | A1 | 3/2019 | Kurosawa et al. |
| 2022/0208730 | A1 | 6/2022 | Jang |

* cited by examiner

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2022-197857, filed on Dec. 12, 2022, the entire contents of which are incorporated herein by reference.

BACKGROUND OF THE INVENTION

Field of the Invention

The embodiment relates to a semiconductor device and a method for manufacturing a semiconductor device.

Description of the Related Art

Among semiconductor devices, there is a semiconductor device in which a plurality of laminated semiconductor chips is mounted on a mounted substrate.

DETAILED DESCRIPTION OF THE PREFERRED EMBODIMENTS

Figure 1:
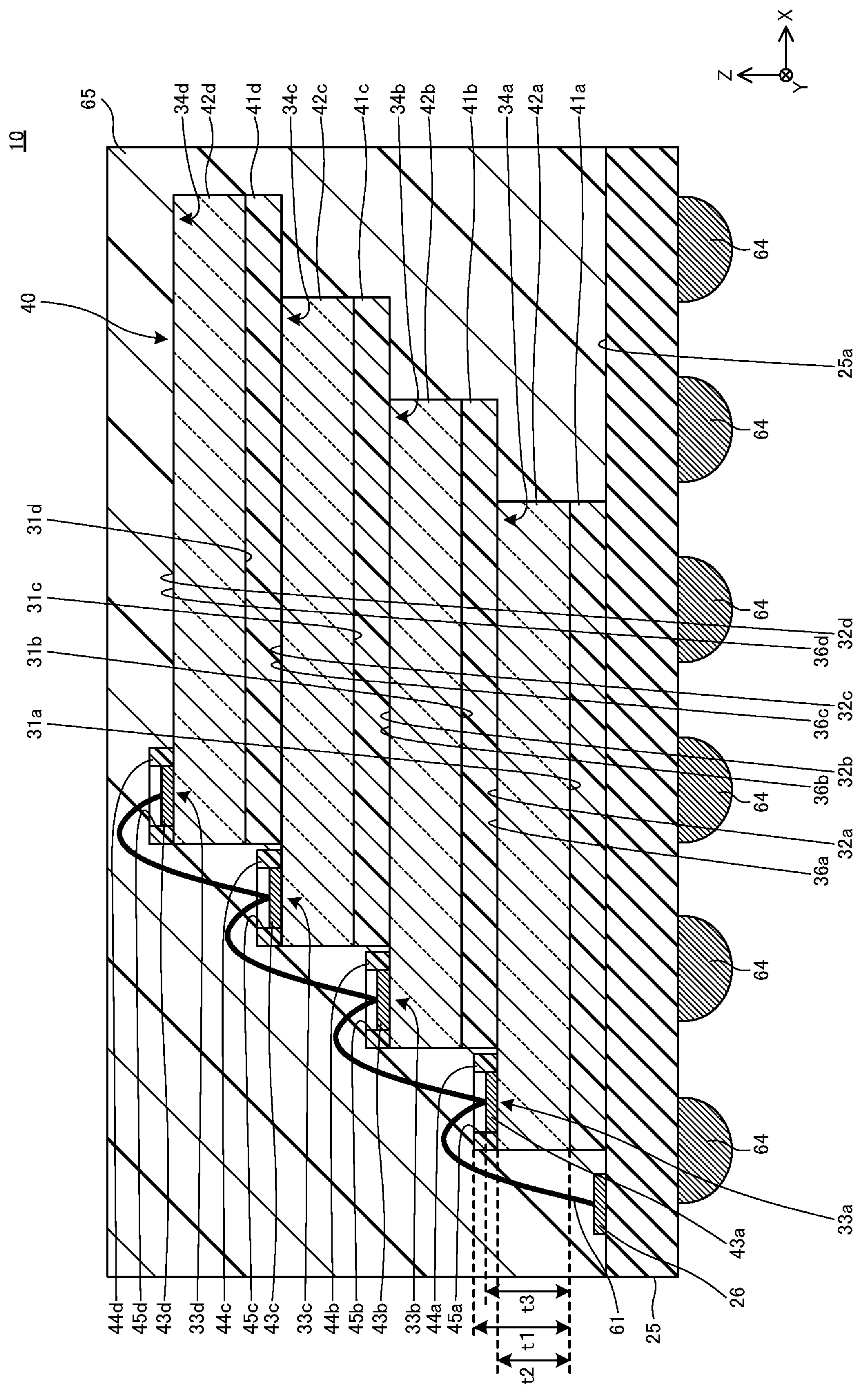
FIG. 1 is a schematic view showing a cross-section of a semiconductor device according to a first embodiment as viewed laterally.

Embodiments will be described below with reference to the accompanying drawings. For facilitating understanding of descriptions, in the drawings, identical constituent elements are denoted by identical reference characters as much as possible, and repetitive descriptions are omitted.

First Embodiment

The configuration of a semiconductor device according to a first embodiment will be described below. In some of the drawings, an X-axis, a Y-axis, and a Z-axis are shown. The X-axis, the Y-axis, and the Z-axis form three-dimensional orthogonal coordinates in a right-handed system. Hereinafter, the direction of the arrow of the X-axis is occasionally referred to as an X-axis+direction, and the opposite direction of the arrow is occasionally referred to as an X-axis− direction. The same goes for the other axes. The Z-axis+ direction and the Z-axis−direction are occasionally referred to as “upper direction” and “lower direction”, respectively. A plane orthogonal to the X-axis, the Y-axis, or the Z-axis is occasionally referred to as a YZ plane, a ZX plane, or an XY plane, respectively.

FIG. 1 is a schematic view showing a cross-section of the semiconductor device according to the first embodiment, which is a cross-section parallel to the ZX plane. As shown in FIG. 1, a semiconductor device 10 (an example of the "semiconductor memory device") includes a wiring substrate 25 (an example of the "substrate"), a chip laminated body 40, bonding wires 61, and a sealing resin 65.

The chip laminated body 40 includes die attach films 41*a*, 41*b* (an example of the "adhesion layer"), 41*c* and 41*d* that are resin layers, semiconductor chips 42*a* (an example of the "second semiconductor chip"), 42*b* (an example of the "first semiconductor chip"), 42*c* (an example of the "third semiconductor chip") and 42*d*, chip electrodes 43*a* (an example of the "second bonding pad"), 43*b* (an example of the "first bonding pad"), 43*c* and 43*d*, and PI (polyimide) films 44*a* (an example of the "first insulating film"), 44*b* (an example of the "second insulating film"), 44*c* and 44*d*.

Hereinafter, each of the die attach films 41*a*, 41*b*, 41*c*, and 41*d* is occasionally referred to as a die attach film 41. Each of the semiconductor chips 42*a*, 42*b*, 42*c*, and 42*d* is occasionally referred to as a semiconductor chip 42. Each of the chip electrodes 43*a*, 43*b*, 43*c*, and 43*d* is occasionally referred to as a chip electrode 43. Each of the PI films 44*a*, 44*b*, 44*c*, and 44*d* is occasionally referred to as a PI film 44.

Figure 2:
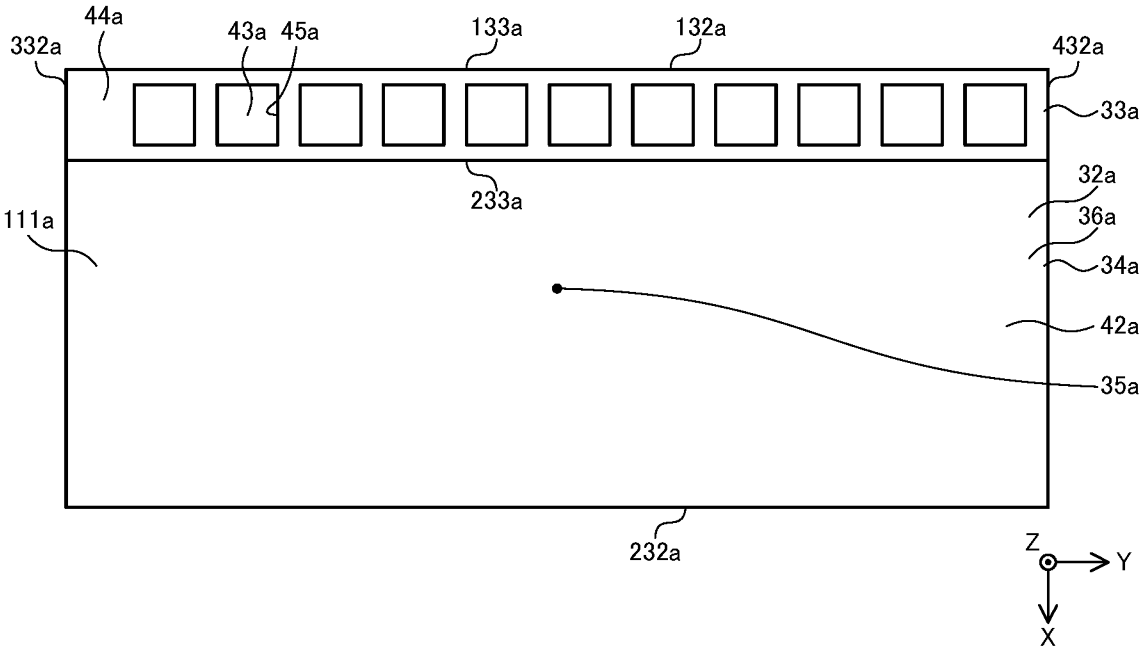
FIG. 2 is a plan view of a semiconductor chip according to the first embodiment as viewed from above.

FIG. 2 is a plan view of the semiconductor chip 42*a* as viewed from above. The configurations of the semiconductor chips 42*b* to 42*d* are the same as the configuration of the semiconductor chip 42*a*. Accordingly, the configuration of the semiconductor chip 42*a* will be described in detail, and the configurations of the semiconductor chips 42*b* to 42*d* will be briefly described.

As shown in FIG. 1 and FIG. 2, for example, the semiconductor chip 42 is a NAND flash memory chip. The semiconductor chip 42 may be a DRAM chip, or may be a chip having another function.

The shape of the semiconductor chip 42*a* is a plate shape in which an upper side and lower side are respectively planes 31*a* (an example of the "first surface") and 32*a* (an example of the "second surface") roughly parallel to the XY plane. The planes 31*a* and 32*a* have a roughly rectangular shape. The short sides and long sides of the rectangular shape are roughly parallel to the X-axis and the Y-axis, respectively.

Hereinafter, of the two facing long sides of the plane 32*a*, the side in the X-axis−direction and the side in the X-axis+ direction are occasionally referred to as a side 132*a* and a side 232*a*, respectively. Of the two facing short sides of the plane 32*a*, the side in the Y-axis−direction and the side in the Y-axis+direction are occasionally referred to as a side 332*a* and a side 432*a*, respectively.

The plane 31*a* of the semiconductor chip 42*a* faces an upper plane 25*a* of the wiring substrate 25 across the die attach film 41*a*.

For example, the plane 31*a* has been smoothed by grinding described later. For example, a storage circuit 111*a* (an example of the "memory circuit") is formed on the plane 32*a* on the opposite side of the plane 31*a*. The outermost surface of a portion where the storage circuit 111*a* is formed may be covered with an inorganic film composed of silicon nitride, silicon dioxide, or the like. Alternatively, the outermost surface of the portion where the storage circuit 111*a* is formed may be covered with an organic film.

The plane 32*a* includes a bonding region 33*a* (an example of the "first bonding region") and a lamination region 34*a* (an example of the "first lamination region"). The chip electrode 43*a* and the PI film 44*a* are arranged at the bonding region 33*a*.

In the embodiment, for example, the PI film 44*a* is a film for which photolithography processing can be performed, as exemplified by a photosensitive polyimide film. The PI film 44*a* is arranged around the chip electrode 43*a*, and covers the storage circuit 111*a*.

The outer shape of the bonding region 33*a* coincides with the outer shape of the region where the PI film 44*a* is formed. Specifically, the bonding region 33*a* has a rectangular shape that is long in the Y-axis direction, and is positioned so as to be closer to the side 132*a* than to the side 232*a*.

More specifically, the side 133*a* of the bonding region 33*a* in the X-axis−direction abuts on the side 132*a*. The side 233*a* of the bonding region 33*a* in the X-axis+direction is positioned in the X-axis−direction relative to a center 35*a* of the plane 32*a*. The side of the bonding region 33*a* in the Y-axis−direction and the side of the bonding region 33*a* in the Y-axis+direction abut on the sides 332*a* and 432*a*, respectively.

At the bonding region 33*a*, the plurality of chip electrodes 43*a* is arranged on a straight line roughly parallel to the Y-axis. More specifically, a plurality of hole portions 45*a* each of which has a rectangular cross-section and reaches the storage circuit 111*a* is formed on the PI film 44*a* by photolithography processing. The chip electrode 43*a* is a metal electrode that is formed in the hole portion 45*a*, and includes one end that is electrically connected to the storage circuit 111*a* and the other end that is an exposed surface to which the bonding wire 61 is connected.

The PI film 44*a* is formed so as to be higher than the chip electrode 43*a* (namely, the surface of the PI film 44*a* is formed that being higher than a surface of the second bonding pad). Accordingly, a thickness t1 of the semiconductor chip 42*a* at a portion where the PI film 44*a* is formed is larger than a thickness t3 of the semiconductor chip 42*a* at a portion where the chip electrode 43*a* is formed. That is, the exposed surface of the chip electrode 43*a*, namely, the other end is dented with respect to the PI film 44*a*.

The lamination region 34*a* that has the low-level surface 36*a* formed so as to be lower than a surface of the first insulating film The height of a surface (an example of the "first low-level surface"; occasionally referred to as a low-level surface 36*a* hereinafter) of the lamination region 34*a* on the plane 32*a* is lower than the height of the upper surface of the PI film 44*a*, and the semiconductor chip 42*b* is arranged on at least a part of the low-level surface 36*a*.

In the embodiment, on the plane 32*a*, the lamination region 34*a* is a region in the X-axis+direction relative to the side 233*a*. That is, the lamination region 34*a* is a region where neither the PI film 44*a* nor the chip electrode 43*a* is formed and where the storage circuit 111*a* is exposed. Therefore, a thickness t2 of the lamination region 34*a* is smaller than the thicknesses t1 and t3 of the bonding region 33*a*.

The die attach film 41*a* is arranged between the semiconductor chip 42*a* and the wiring substrate 25, and performs adhesion between the plane 31*a* of the semiconductor chip 42*a* and the plane 25*a* of the wiring substrate 25.

The semiconductor chip 42*b* includes a plane 31*b* (an example of the "third surface") that faces the wiring substrate 25 across the semiconductor chip 42*a*, and a plane 32*b* (an example of the "fourth surface") on the opposite side of the plane 31*b*. That is, the planes 31*b* and 32*b* are the lower plane and upper plane of the semiconductor chip 42*b*, respectively.

The plane 32*b* includes a bonding region 33*b* (an example of the "second bonding region") and a lamination region 34*b* (an example of the "second lamination region"). The PI film 44*b* and the plurality of chip electrodes 43*b* are arranged on the bonding region 33*b*. The lamination region 34*b* has a low-level surface 36*b* (an example of the "second low-level surface") formed so as to be lower than an upper surface of the PI film 44*b* (namely, the lamination region 34*b* has a low-level surface 36*b* formed that being lower than a surface of the second insulating film). The number of chip electrodes 43*b* that are provided is the same as the number of the chip electrodes 43*a*.

The die attach film 41*b* performs adhesion between at least a part of the lamination region 34*a* on the plane 32*a* and at least a part of the plane 31*b*.

In the embodiment, the die attach film 41*b* is arranged between the semiconductor chip 42*a* and the semiconductor chip 42*b*. There is a gap between the die attach film 41*b* and the PI film 44*a* positioned in the X-axis−direction of the die attach film 41*b*. Therefore, the die attach film 41*b* performs adhesion between a part of the lamination region 34*a* in the X-axis+direction and the plane 31*b*. It is allowable to adopt a configuration in which the die attach film 41*b* performs adhesion between the whole of the lamination region 34*a* and the plane 31*b* with no gap with the PI film 44*a*.

The configurations of the semiconductor chips 42*c* and 42*d* are the same as the configurations of the semiconductor chips 42*a* and 42*b*.

The die attach film 41*c* performs adhesion between an X-axis+directional part of the lamination region 34*b* on the plane 32*b* of the semiconductor chip 42*b* and a lower plane 31*c* of the semiconductor chip 42*c*. It is allowable to adopt a configuration in which the die attach film 41*c* performs adhesion between the whole of the lamination region 34*b* and the plane 31*c* with no gap with the PI film 44*b*.

The die attach film 41*d* performs adhesion between an X-axis+directional part of the lamination region 34*c* on a plane 32*c* of the semiconductor chip 42*c* and a lower plane 31*d* of the semiconductor chip 42*d*. It is allowable to adopt a configuration in which the die attach film 41*d* performs adhesion between the whole of the lamination region 34*c* and the plane 31*d* with no gap with the PI film 44*c*.

The wiring substrate 25 includes a plane 25*a* that faces the plane 31*a* of the semiconductor chip 42*a*. For example, the plane 25*a* has a rectangular shape. On the plane 25*a*, for example, in the X-axis−direction of the semiconductor chip 42*a*, a plurality of substrate electrodes 26 is arranged on a straight line roughly parallel to the Y-axis. The number of substrate electrodes 26 that are provided is the same as the number of the chip electrodes 43*a*.

The number of bonding wires 61 that are provided is the same as the number of the chip electrodes 43*a*. That is, the number of sets of the substrate electrode 26, the bonding wire 61, and the chip electrodes 43*a*, 43*b*, 43*c*, and 43*d* that are provided is the same as the number of the chip electrodes 43*a*. Each bonding wire 61 electrically connects the substrate electrode 26 and the chip electrodes 43*a*, 43*b*, 43*c*, and 43*d* in the set.

A plurality of solder balls 64 (an example of the "external terminal") is arranged on a lower surface of the wiring substrate 25. Each of the plurality of solder balls 64 is electrically connected to a controller chip (not illustrated) through an electrode pattern (not illustrated) and a via (not illustrated), for example. For example, the controller chip is arranged on a lateral side of the chip laminated body 40, and operates by signals and electric power that are supplied from the exterior through the solder ball 64.

Each of the plurality of substrate electrodes 26 is electrically connected to a controller chip (not illustrated) through an electrode pattern (not illustrated), for example. The controller chip controls the semiconductor chip 42 by supplying a control signal to the semiconductor chip 42 through the substrate electrode 26 and the bonding wire 61.

The sealing resin 65 seals at least the semiconductor chips 42*a*, 42*b*, 42*c*, and 42*d*, and the bonding wires 61. Specifically, the chip laminated body 40 and the bonding wires 61 are buried in the sealing resin 65, on the wiring substrate 25. The chip laminated body 40 and the bonding wires 61 are sealed by the sealing resin 65 in an insulated manner.

COMPARATIVE EXAMPLE

Figure 3:
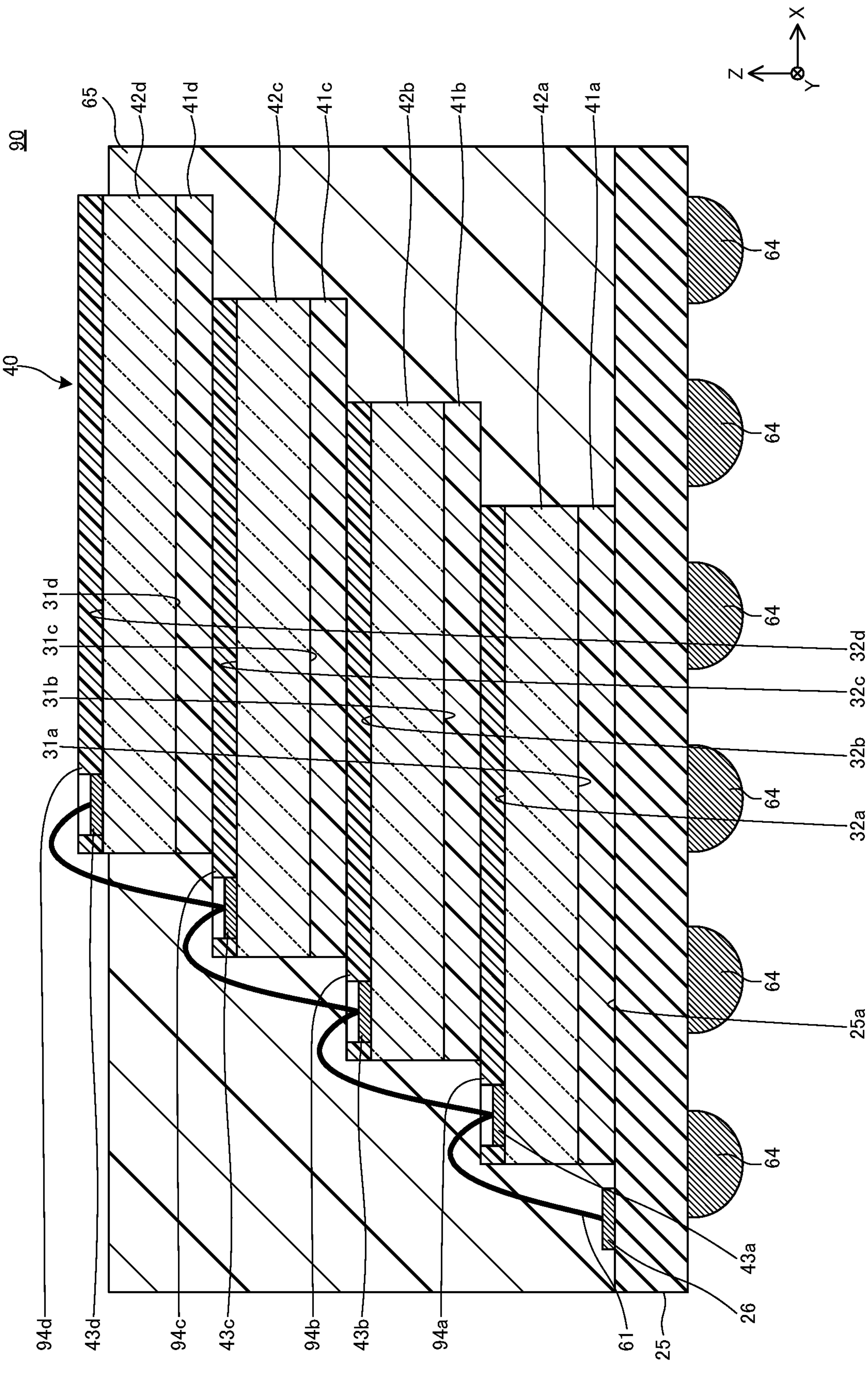
FIG. 3 is a schematic view showing a cross-section of a semiconductor device according to a comparative example as viewed laterally.

FIG. 3 is a schematic view showing a cross-section of a semiconductor device according to a comparative example as viewed laterally. When compared to the semiconductor device 10 shown in FIG. 1 and FIG. 2, as shown in FIG. 3, a semiconductor device 90 according to the comparative example includes PI films 94*a* to 94*d*, instead of the PI films 44*a* to 44*d*.

In the semiconductor device 90, the lamination region 34*a* is not provided on the upper plane 32*a* of the semiconductor chip 42*a*, and instead, the PI film 94*a* is arranged. The die attach film 41*b* performs adhesion between the lower plane 31*b* of the semiconductor chip 42*b* and an upper plane of the PI film 94*a*.

Similarly, the lamination regions 34*b* to 34*d* are not provided on the upper planes 32*b* to 32*d* of the semiconductor chips 42*b* to 42*d*, and instead, the PI films 94*b* to 94*d* are arranged. The die attach film 41*c* performs adhesion between the lower plane 31*c* of the semiconductor chip 42*c* and an upper plane of the PI film 94*b*. The die attach film 41*d* performs adhesion between the lower plane 31*d* of the semiconductor chip 42*d* and an upper plane of the PI film 94*c*.

That is, in the semiconductor device 90, the lamination region formed so as to be lower than the upper plane of the PI film is not provided. Therefore, the total height of the chip laminated body 40 is large. In contrast, in the semiconductor device 10 shown in FIG. 1, the semiconductor chips 42*b* to 42*d* are laminated on the lamination regions 34*a* to 34*c* having a small thickness, respectively, and thereby it is possible to reduce the total height of the chip laminated body 40. Thereby, it is possible to reduce the thickness of the sealing resin 65 in the semiconductor device 10, and further it is possible to reduce the whole thickness of the semiconductor device 10. Further, it is possible to shorten the distance among the semiconductor chips 42, and therefore it is possible to improve the heat dissipation of the semiconductor chips 42.

On the other hand, if the chip laminated body 40 and the bonding wires 61 in the semiconductor device 90 are sealed by a sealing resin 65 having the same thickness as the thickness of the sealing resin 65 in the semiconductor device 10, a part of the chip laminated body 40 and the bonding wire 61 are exposed from the sealing resin 65, in the semiconductor device 90.

Further, because of the configuration in which the PI film 44*a* is arranged around the chip electrode 43*a*, even if the bonding wire 61 is bent by external force, the bonding wire 61 can easily abut on the PI film 44*a* instead of the semiconductor chip 42*a*. Thereby, it is possible to reduce the possibility of the occurrence of electric short circuit.

[Method for Manufacturing Semiconductor Device]

Figure 4:
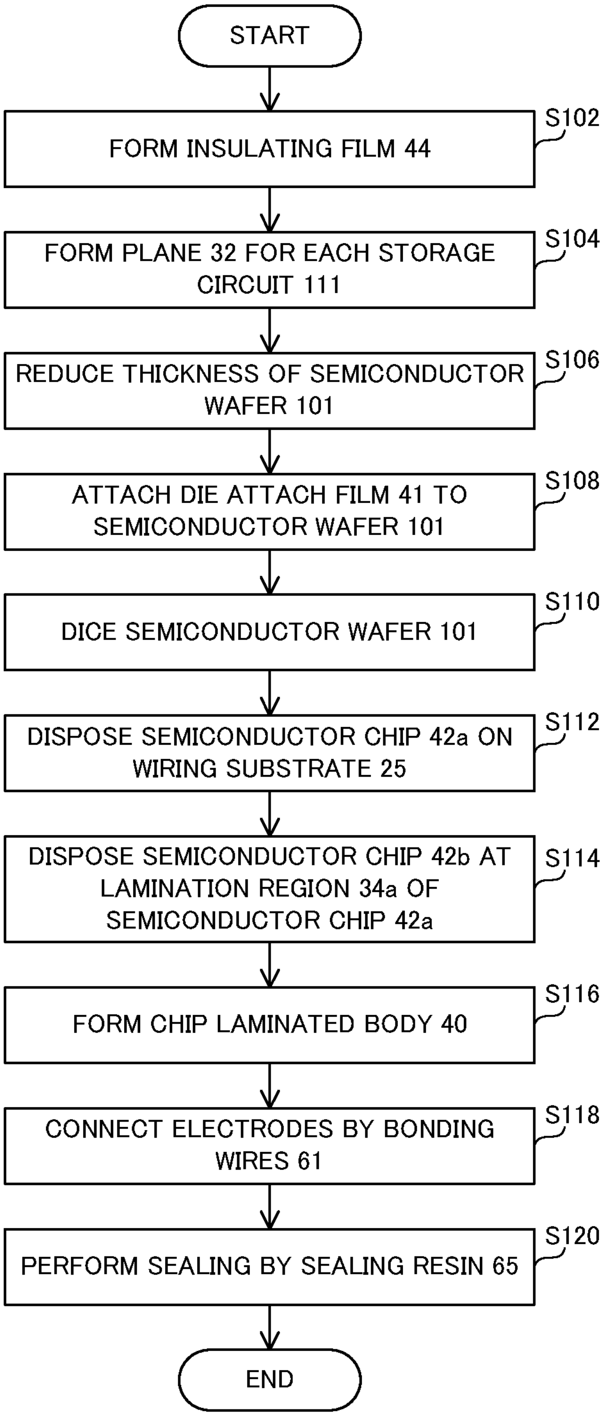
FIG. 4 is a flowchart showing an exemplary method for manufacturing the semiconductor device according to the first embodiment.

A method for manufacturing the semiconductor device 10 will be described below as an example of the method for manufacturing the semiconductor device according to the embodiment. FIG. 4 is a flowchart showing an exemplary method for manufacturing the semiconductor device according to the embodiment.

Figure 5A:
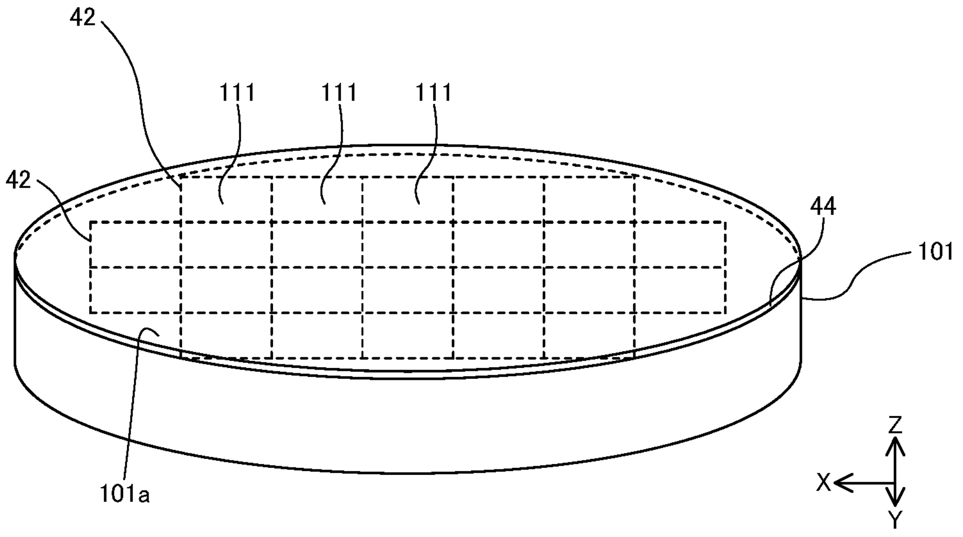
FIG. 5A is a schematic view showing a production process for the semiconductor device according to the first embodiment.

First, as shown in FIG. 4 and FIG. 5A, a PI film 44 (an example of the "insulating film") is formed on a circuit plane 101*a* (an example of the "first plane") on the upper side of a semiconductor wafer 101 on which a plurality of storage circuits 111 that is to be respectively included in a plurality of semiconductor chips 42 is formed (step S102).

Figure 5B:
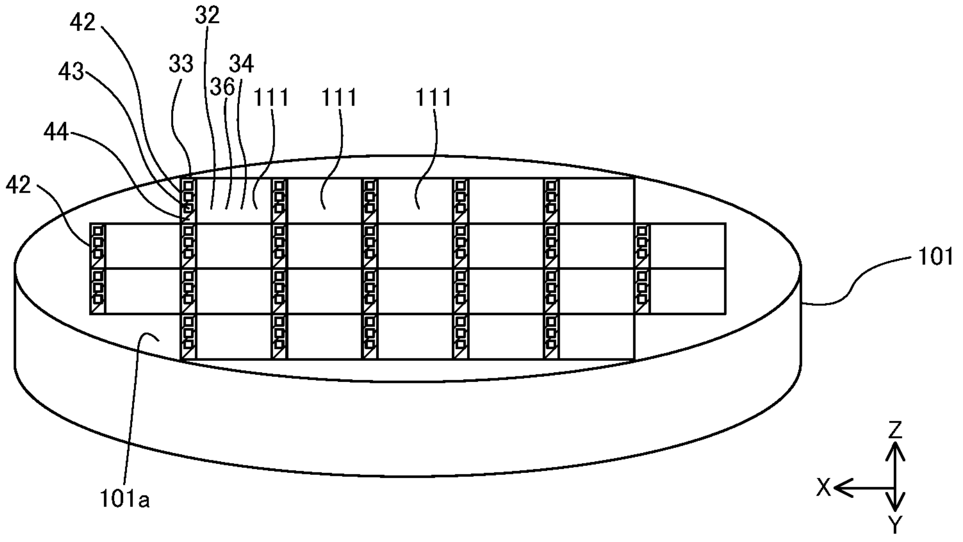
FIG. 5B is a schematic view showing a production process for the semiconductor device according to the first embodiment.

Next, as shown in FIG. 4 and FIG. 5B, a plane 32 that is a part of the circuit plane 101*a* is formed for each storage circuit 111 (step S104). The plane 32 includes a bonding region 33 and a lamination region 34. A chip electrode 43 and a part of a PI film 44 are arranged at the bonding region 33. The lamination region 34 has a low-level surface 36 formed so as to be lower than the upper surface of the PI film 44 (namely, the lamination region 34 has a low-level surface 36 formed that being lower than a surface of the insulating film), and the semiconductor chip 42 can be arranged on at least a part of the low-level surface 36.

Specifically, by the photolithography processing of the PI film 44, the PI film 44 at a portion of the bonding region 33 where the chip electrode 43 is to be formed and the PI film 44 at the lamination region 34 are removed.

More specifically, the PI film 44 is exposed in a predetermined pattern, and thereafter extra PI films 44 are removed by wet etching. At this time, at least the PI film 44 at the above portion and the PI film 44 at the lamination region 34 are removed. Then, the PI film 44 is cured, and thereafter the chip electrode 43 is formed at the above portion.

Figure 5C:
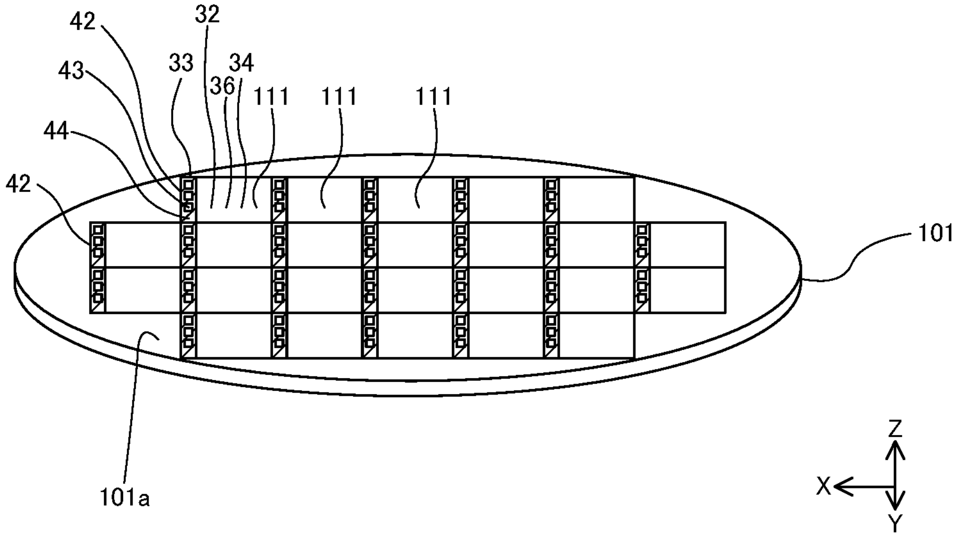
FIG. 5C is a schematic view showing a production process for the semiconductor device according to the first embodiment.

Next, as shown in FIG. 4 and FIG. 5C, the thickness of the semiconductor wafer 101 is reduced by removing a lower portion of the semiconductor wafer 101 (step S106). Specifically, a lower plane of the semiconductor wafer 101 where the storage circuit 111 is not formed is ground by grinding stone. Thereby, the thickness of the semiconductor wafer 101 is reduced.

Figure 5D:
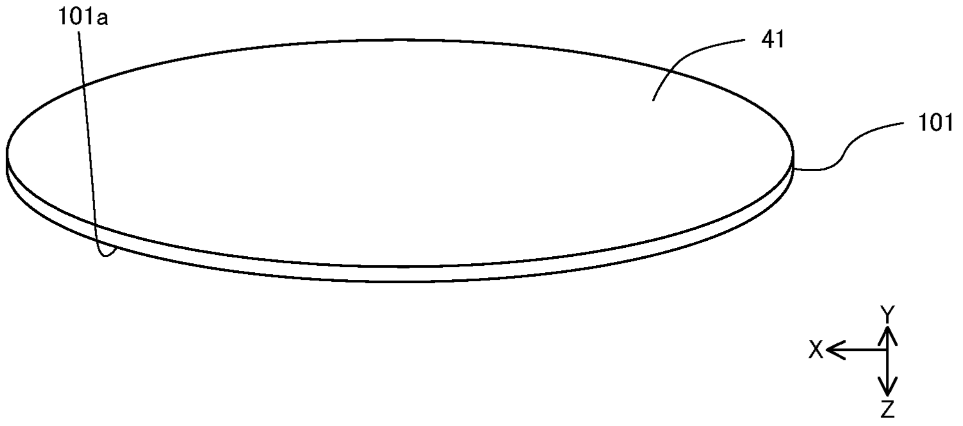
FIG. 5D is a schematic view showing a production process for the semiconductor device according to the first embodiment.

Next, as shown in FIG. 4 and FIG. 5D, a die attach film 41 is attached to a lower plane of the semiconductor wafer 101 (step S108).

Figure 5E:
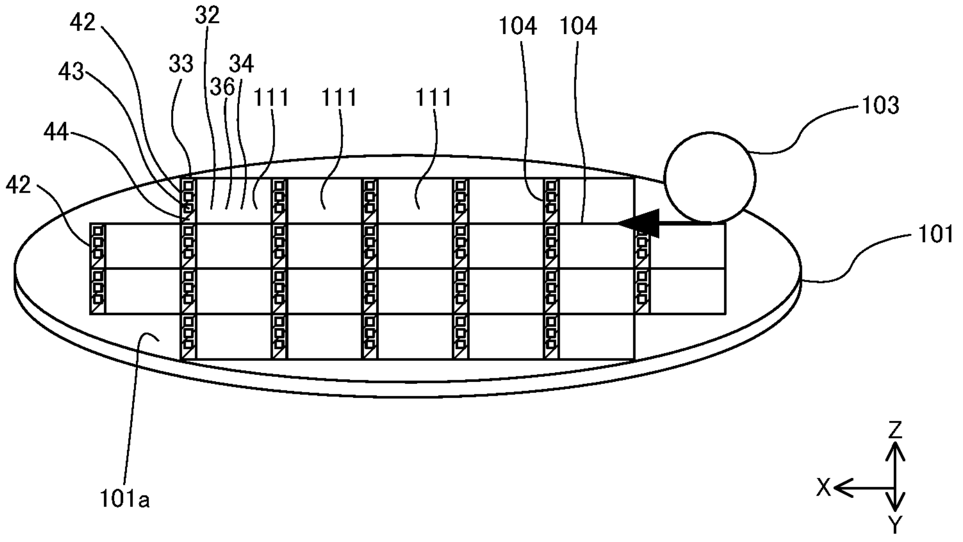
FIG. 5E is a schematic view showing a production process for the semiconductor device according to the first embodiment.

Next, as shown in FIG. 4 and FIG. 5E, on the circuit plane 101*a* on the upper side of the semiconductor wafer 101, the semiconductor wafer 101 is diced by putting in a blade 103 along dicing lines 104 (step S110). The semiconductor wafer 101 is separated into a plurality of semiconductor chips 42.

Figure 5F:
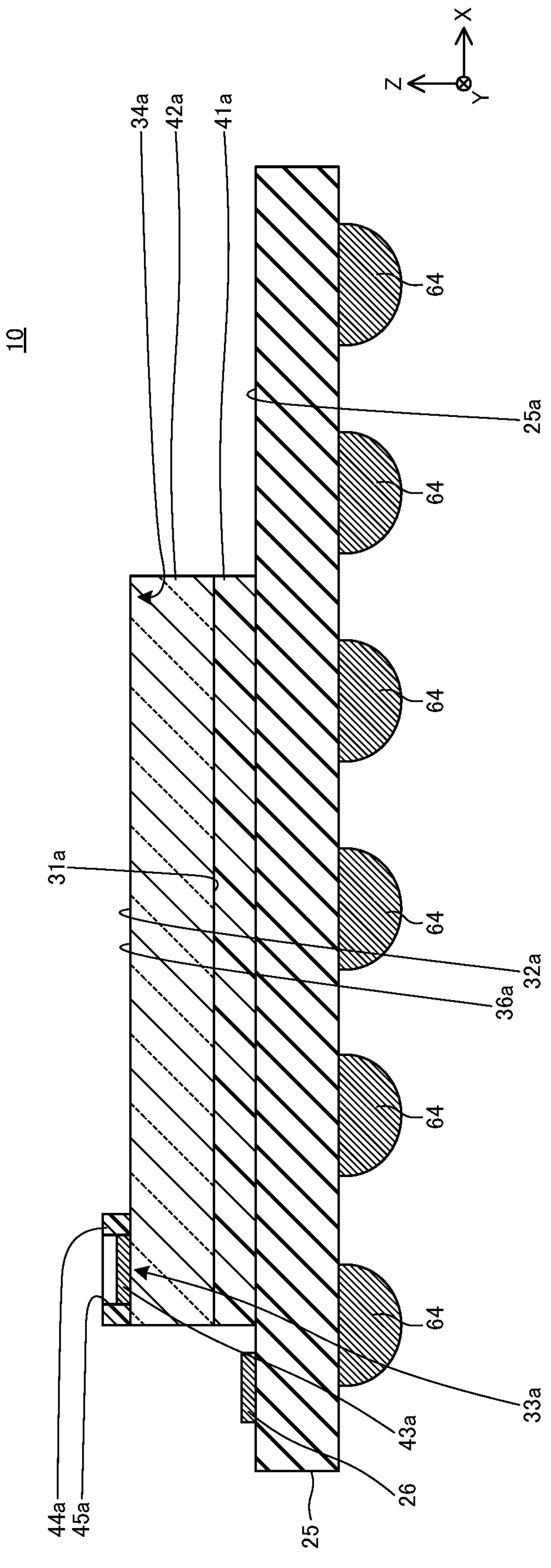
FIG. 5F is a schematic view showing a production process for the semiconductor device according to the first embodiment.

Next, as shown in FIG. 4 and FIG. 5F, the semiconductor chip 42*a*, which is one of the plurality of semiconductor chips 42 separated from the semiconductor wafer 101, is disposed on the wiring substrate 25 (step S112). Specifically, the plane 31*a* of the semiconductor chip 42*a* is caused to adhere to the plane 25*a* of the wiring substrate 25, by the die attach film 41*a*.

Figure 5G:
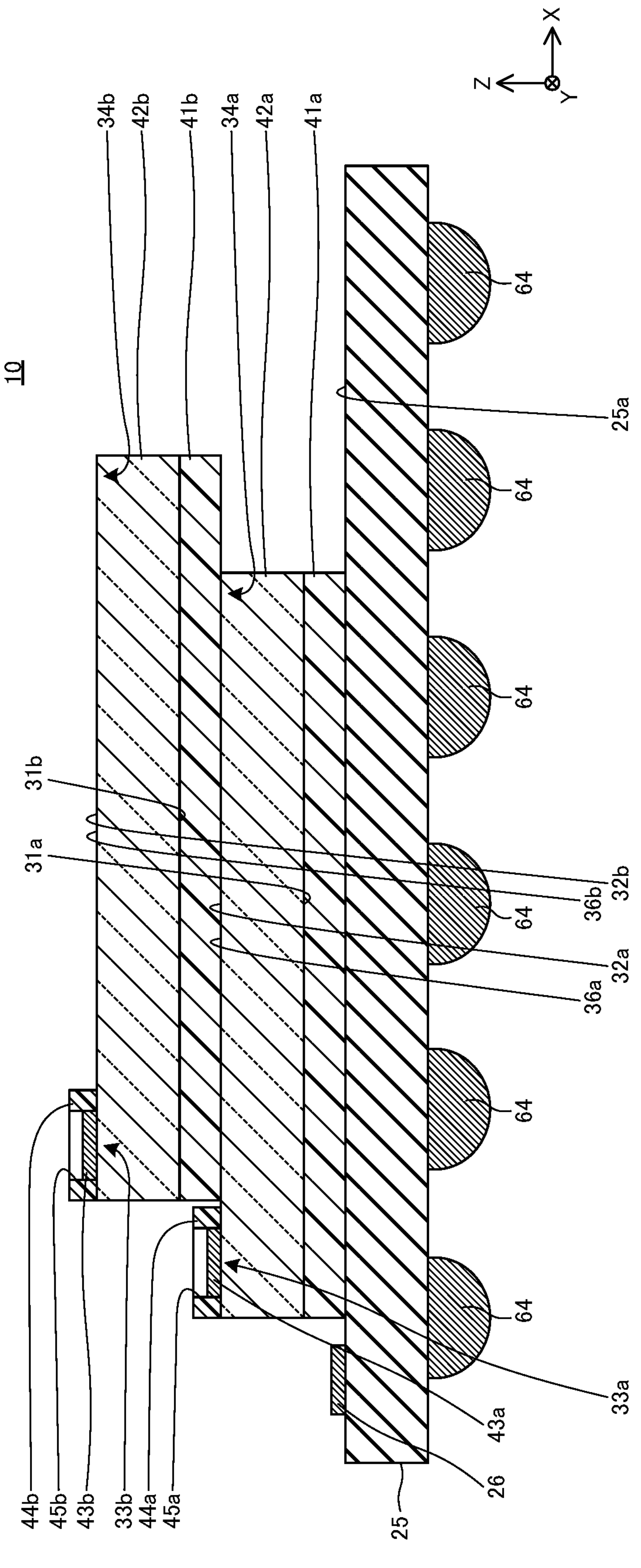
FIG. 5G is a schematic view showing a production process for the semiconductor device according to the first embodiment.

Next, as shown in FIG. 4 and FIG. 5G, the semiconductor chip 42*b*, which is another one of the plurality of semiconductor chips 42 separated from the semiconductor wafer 101, is disposed at the lamination region 34*a* of the semiconductor chip 42*a* (step S114). Specifically, the plane 31*b* of the semiconductor chip 42*b* is caused to adhere to the lamination region 34*a* of the semiconductor chip 42*a*, by the die attach film 41*b*.

Figure 5H:
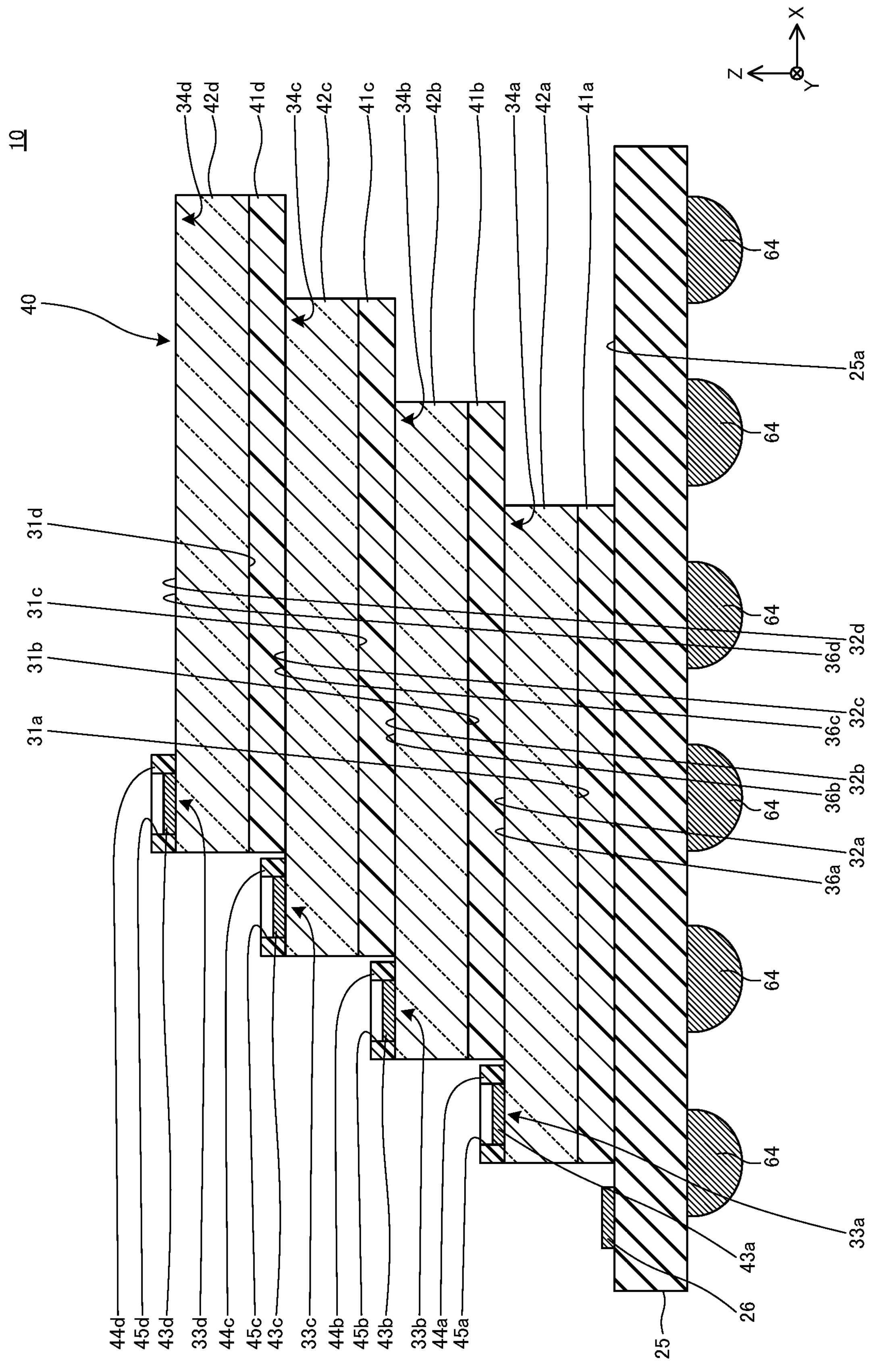
FIG. 5H is a schematic view showing a production process for the semiconductor device according to the first embodiment.

Next, as shown in FIG. 4 and FIG. 5H, similarly to the semiconductor chip 42*b*, the semiconductor chips 42*c* and 42*d* are disposed at the lamination region 34*b* of the semiconductor chip 42*b* and the lamination region 34*c* of the semiconductor chip 42*c*, respectively. Thereby, the chip laminated body 40 is formed (step S116).

Figure 5I:
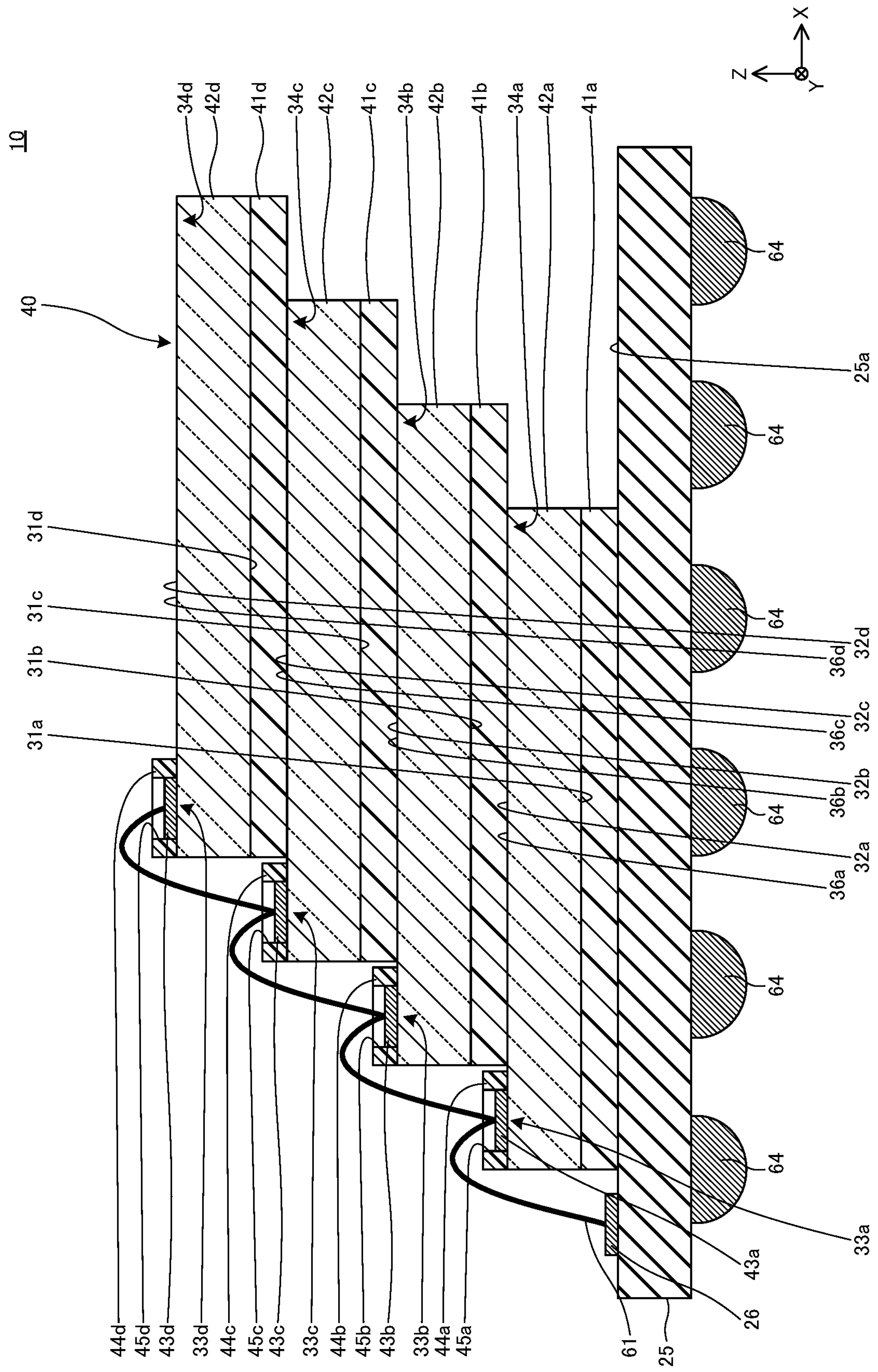
FIG. 5I is a schematic view showing a production process for the semiconductor device according to the first embodiment.

Next, as shown in FIG. 4 and FIG. 5I, the substrate electrodes 26 and the chip electrodes 43*a*, 43*b*, 43*c*, and 43*d* on the wiring substrate 25 are electrically connected by the bonding wires 61 (step S118).

Next, as shown in FIG. 1 and FIG. 4, the chip laminated body 40 and the bonding wires 61 are sealed by the sealing resin 65 (step S120).

Second Embodiment

A semiconductor device 12 according to a second embodiment will be described. In the second embodiments and subsequent embodiments, descriptions about matters in common with the first embodiment will be omitted, and only different points will be described. Particularly, the same function effects due to the same configurations will not be mentioned in all embodiments.

Figure 6:
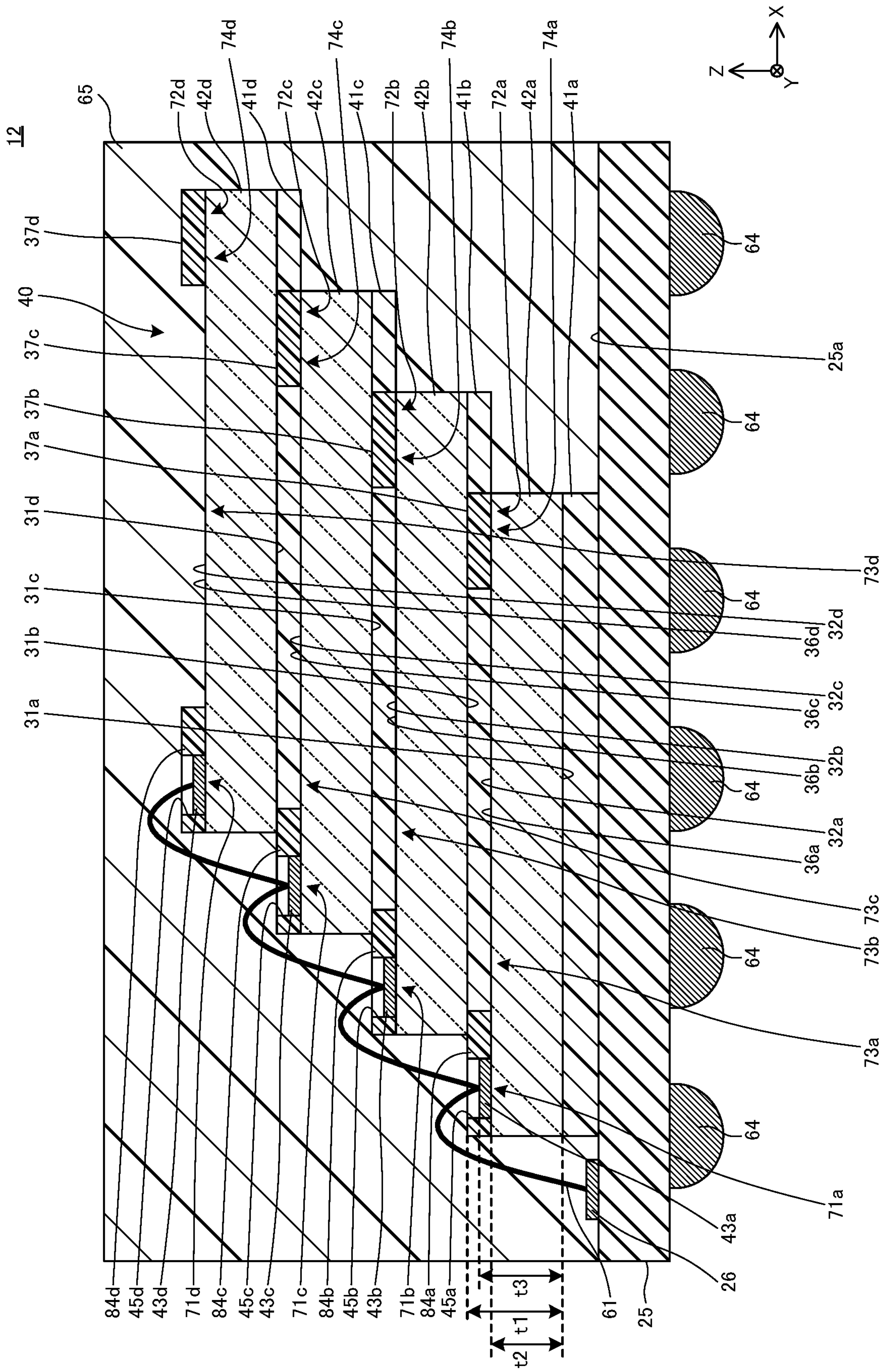
FIG. 6 is a schematic view showing a cross-section of a semiconductor device according to a second embodiment as viewed laterally.
Figure 7:
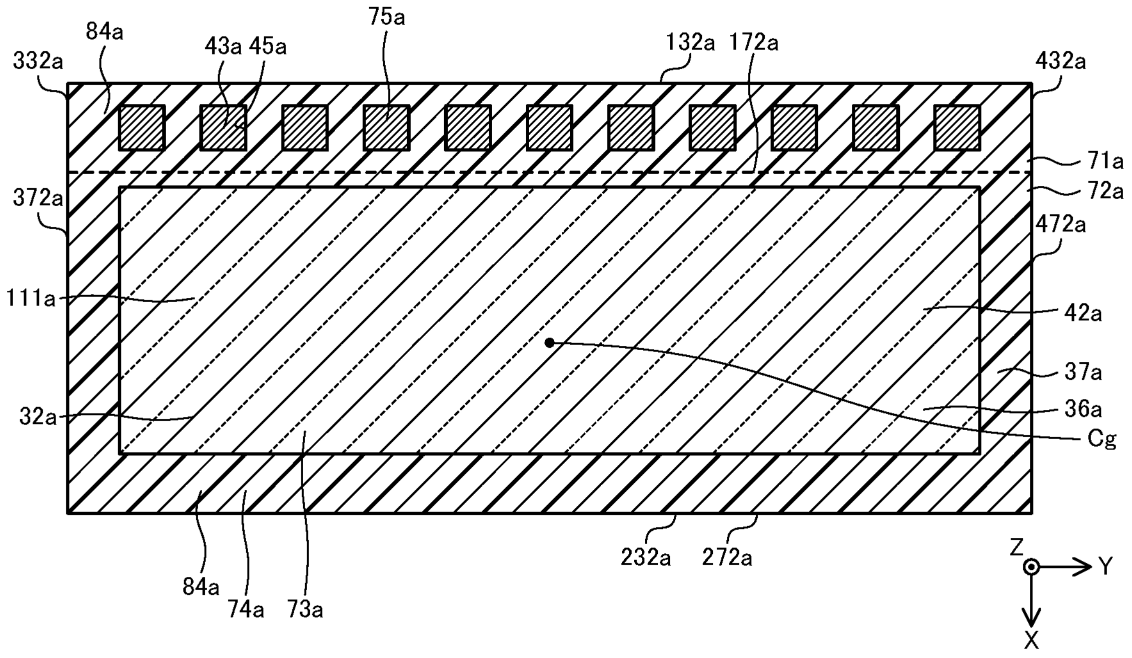
FIG. 7 is a plan view of a semiconductor chip according to the second embodiment as viewed from above.

FIG. 6 is a schematic view showing a cross-section of the semiconductor device according to the second embodiment, which is a cross-section parallel to the ZX plane. FIG. 7 is a plan view of the semiconductor chip according to the second embodiment as viewed from above. As shown in FIG. 6 and FIG. 7, the semiconductor device 12 (an example of the "semiconductor memory device") is different from the semiconductor device 10 shown in FIG. 1 and FIG. 2, in the shape of the region where the PI film is arranged.

The configurations of the semiconductor chips 42*b* to 42*d* are the same as the configuration of the semiconductor chip 42*a*. Accordingly, the configuration of the semiconductor chip 42*a* will be described in detail, and the configurations of the semiconductor chips 42*b* to 42*d* will be briefly described.

The upper plane 32*a* (an example of the "second surface") of the semiconductor chip 42*a* includes a chip arrangement region 72*a* (an example of the "first chip arrangement region") where the semiconductor chip 42*b* (an example of the "first semiconductor chip") is arranged, and an adjacent region 71*a* that is adjacent to the chip arrangement region 72*a* (see FIG. 7).

In the embodiment, the chip arrangement region 72*a* is a region having a rectangular shape that is long in the Y-axis direction. An edge 172*a* of the chip arrangement region 72*a* in the X-axis−direction and an edge 272*a* of the chip arrangement region 72*a* in the X-axis+direction are roughly parallel to the Y-axis. An edge 372*a* of the chip arrangement region 72*a* in the Y-axis−direction and an edge 472*a* of the chip arrangement region 72*a* in the Y-axis+direction are roughly parallel to the X-axis.

The adjacent region 71*a* is positioned in the X-axis−direction of the chip arrangement region 72*a*, and is adjacent to the chip arrangement region 72*a* through the edge 172*a*. The adjacent region 71*a* is a region having a rectangular shape that is long in the Y-axis direction. The adjacent region 71*a* does not overlap with the chip arrangement region 72*a*.

That is, when the plane 32*a* is divided at the edge 172*a* into two regions, the region positioned in the X-axis+direction is the chip arrangement region 72*a*, and the region positioned in the X-axis−direction is the adjacent region 71*a*. Each shape of the adjacent region 71*a* and the chip arrangement region 72*a* is not limited to a rectangular shape, and may be an arbitrary shape.

The plane 32*a* includes a low-level surface region 73*a*, a high-level surface region 74*a*, and a plurality of chip electrode regions 75*a*.

The whole of the low-level surface region 73*a* overlaps with the chip arrangement region 72*a*. In the embodiment, the low-level surface region 73*a* includes a gravity center Cg of the chip arrangement region 72*a*. The low-level surface region 73*a* may be configured such that a part of the low-level surface region 73*a* overlaps with the chip arrangement region 72*a*. The low-level surface region 73*a* has a low-level surface 36*a* (an example of the "third low-level surface") formed so as to be lower than a high-level surface 37*a* at the high-level surface region 74*a*.

Herein, the low-level surface region 73*a* ("lower surface area 73*a*") means a surface region where the height from a reference position is less than a first height. The high-level surface region 74*a* ("higher surface area 74*a*") means a surface region where the height from the reference position is equal to or more than the first height and is less than a second height (the second height is more than the first height). For example, the reference position means the upper surface of the semiconductor chip 42*a*, that is, the plane 32*a*. A low-level surface region including the low-level surface region 73*a* may be referred to as a first surface region where the height from the reference position is less than the first height. A high-level surface region including the high-level surface region 74*a* may be referred to as a second surface region where the height from the identical reference position is equal to or more than the first height and is less than the second height.

The low-level surface region 73*a* is a region having a rectangular shape that is long in the Y-axis direction. The low-level surface region 73*a* is a region where the upper surface of the semiconductor chip 42*a* is exposed. The shape of the low-level surface region 73*a* is not limited to a rectangular shape, and may be an arbitrary shape.

A PI film 84*a* (an example of the "first insulating film") is arranged at the high-level surface region 74*a*. An upper plane of the PI film 84*a* is the high-level surface 37*a*. The high-level surface region 74*a* extends over the chip arrangement region 72*a* and the adjacent region 71*a*. A part of the high-level surface region 74*a* overlaps with the chip arrangement region 72*a*, and another part overlaps with the adjacent region 71*a*. It is allowable to adopt a configuration in which the whole of the high-level surface region 74*a* overlaps with a part of the chip arrangement region 72*a*.

The high-level surface region 74*a* is adjacent to the low-level surface region 73*a*. In the embodiment, the high-level surface region 74*a* surrounds the low-level surface region 73*a*. The high-level surface region 74*a* positioned so as to be closer to the edge 172*a*, 272*a*, 372*a*, or 472*a* of the chip arrangement region 72*a* than to the gravity center Cg. The high-level surface region 74*a* contacts with sides (an example of the "edge") 132*a*, 232*a*, 332*a*, and 432*a* of the plane 32*a*, in planar view of the plane 32*a*.

The plurality of chip electrode regions 75*a* is included in the adjacent region 71*a*. Specifically, the plurality of chip electrode regions 75*a* is positioned so as to be arrayed roughly parallel to the Y-axis, in the adjacent region 71*a*. At the plurality of chip electrode regions 75*a*, the PI film 84*a* is not arranged, and the hole portions 45*a* are provided respectively. The chip electrodes 43*a* are arranged in the plurality of hole portions 45*a*, respectively. The surface of the PI film 84*a* is formed so as to be higher than the surface of the chip electrode 43*a* (namely, the surface of the PI film 84*a* is formed that being higher than a surface of the second bonding pad).

The die attach film 41*b* (an example of the "adhesion layer") performs adhesion between at least a part of the low-level surface region 73*a* on the plane 32*a* and at least a part of the plane 31*b* on the semiconductor chip 42*b* (see FIG. 6). In the embodiment, at least a part of the upper plane of the PI film 84*a*, that is, at least a part of the high-level surface 37*a*, and the lower plane 31*b* of the semiconductor chip 42*b* contact with each other.

The plane 32*b* of the semiconductor chip 42*b* includes a chip arrangement region 72*b* (an example of the "second chip arrangement region") where the semiconductor chip 42*c* (an example of the "third semiconductor chip") is arranged, and an adjacent region 71*b* that is adjacent to the chip arrangement region 72*b*.

The chip arrangement region 72*b* and the adjacent region 71*b* are the same as the chip arrangement region 72*a* and the adjacent region 71*a* on the plane 32*a* of the semiconductor chip 42*a*, respectively.

Further, the plane 32*b* includes a low-level surface region 73*b*, a high-level surface region 74*b*, and a plurality of chip electrode regions 75*b*. The low-level surface region 73*b*, the high-level surface region 74*b*, and the chip electrode region 75*b* are the same as the low-level surface region 73*a*, the high-level surface region 74*a*, and the chip electrode region 75*a* on the plane 32*a* of the semiconductor chip 42*a*, respectively.

A PI film 84*b* arranged at the high-level surface region 74*b* is the same as the PI film 84*a* arranged at the high-level surface region 74*a* of the semiconductor chip 42*a*.

Effects

Figure 8:
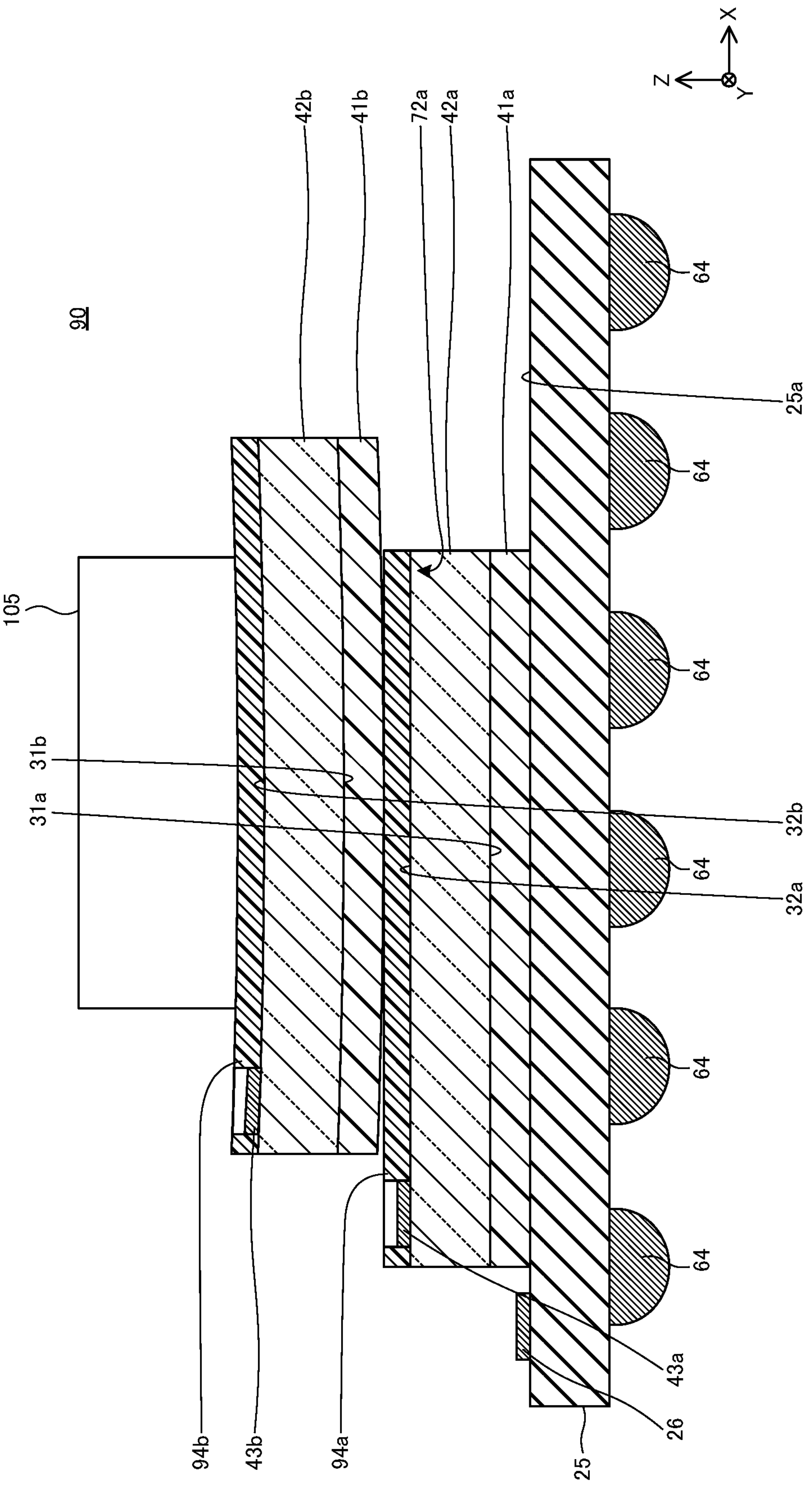
FIG. 8 is a schematic view showing a cross-section of a semiconductor device according to a comparative example as viewed laterally.

As shown in FIG. 8, in the method for manufacturing the semiconductor device 90, when the semiconductor chip 42*b* is placed on the semiconductor chip 42*a*, the semiconductor chip 42*b* is transported by a bonding collet 105, for example. Then, the semiconductor chip 42*b* is pressed onto the semiconductor chip 42*a* by the bonding collet 105.

In the case where the low-level surface region 73*a* is not included on the plane 32*a* and the PI film 94*a* is arranged over the whole of the chip arrangement region 72*a* instead of the PI film 84*a* as shown in FIG. 8, the following problem occasionally occurs.

In the case where the contact area between the bonding collet 105 and the semiconductor chip 42*b* is smaller than the area of the upper plane 32*b* of the semiconductor chip 42*b*, when the bonding collet 105 presses the semiconductor chip 42*b* downward, an end portion of the semiconductor chip 42*b* is occasionally turned upward.

At this time, a portion that is not buried by the die attach film 41*b*, that is, a gap is occasionally formed between the semiconductor chip 42*b* and the PI film 94*a*. Further, there is a possibility that an air bubble or a void is formed in the die attach film 41*b*. As the thickness of the semiconductor chip 42*b* is smaller, the turning becomes more conspicuous and the gap, the air bubble, the void, or the like is more easily generated.

Figure 9:
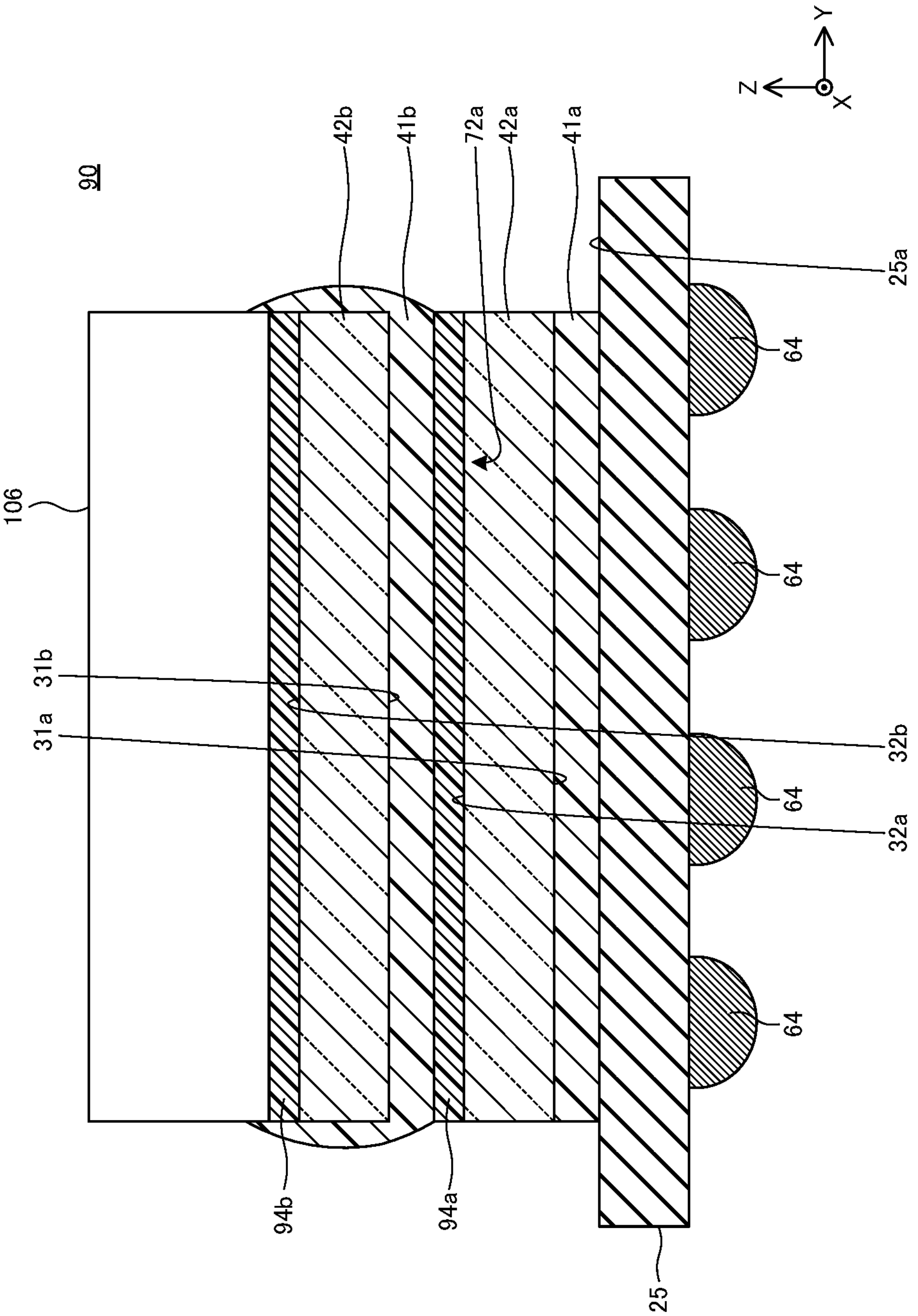
FIG. 9 is a schematic view showing a cross-section of the semiconductor device according to the comparative example as viewed laterally.

Further, as shown in FIG. 9, a bleed phenomenon in which the die attach film 41*b* crawls upward by the pressure for the adhesion of the semiconductor chip 42*b* occurs. For example, in the case where a bonding collet 106 that presses the whole of the upper plane 32*b* of the semiconductor chip 42*b* is used, the bonding collet 106 occasionally gets contact with the crawling die attach film 41*b* and the die attach film 41 occasionally adheres to the bonding collet 106.

In the case where another semiconductor chip 42 (for example, the semiconductor chip 42*c*) is pressed by the bonding collet 106 to which the die attach film 41 adheres, the risk of the transfer of the die attach film 41 to the semiconductor chip 42*c* can become high.

Figure 10:
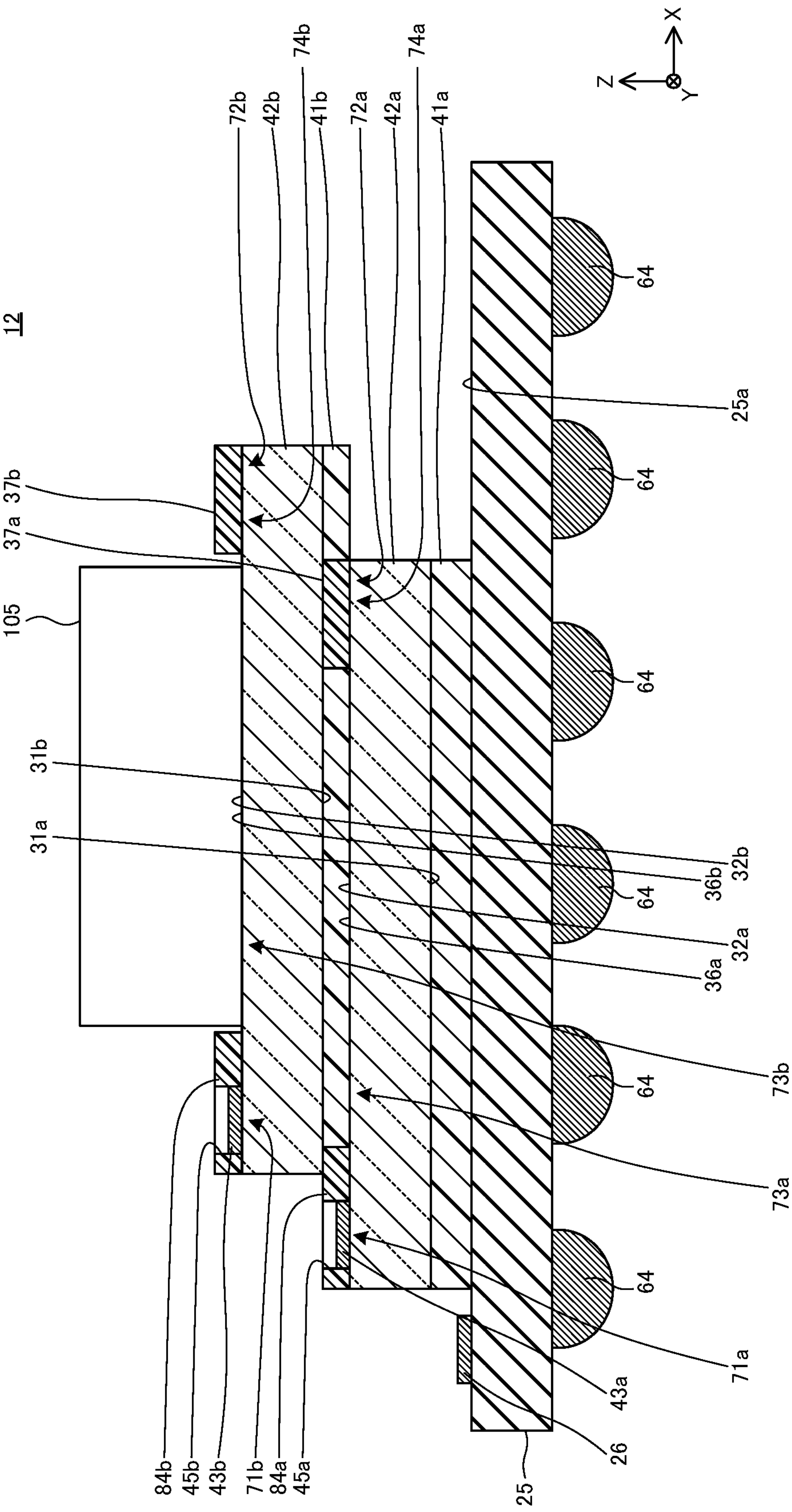
FIG. 10 is a schematic view showing a production process for the semiconductor device according to the second embodiment.

On the other hand, as shown in FIG. 10, in the semiconductor device 12, at a portion that is close to the edge of the semiconductor chip 42*b* and that is not pressed by the bonding collet 105, a step is formed by the high-level surface 37*a* of the PI film 84*a* and the low-level surface 36*a* of the semiconductor chip 42*a*.

Even when the end portion of the semiconductor chip 42*b* is turned upward, the step makes it possible to increase the possibility that the end portion of the semiconductor chip 42*b* and the high-level surface 37*a* of the PI film 84*a* get contact with each other. That is, even when the bonding collet 105 that does not press the whole of the upper plane 32*b* of the semiconductor chip 42*b* is used, it is possible to restrain the gap, the air bubble, the void, or the like from being formed between the semiconductor chip 42*b* and the semiconductor chip 42*a*. Furthermore, it is possible to reduce the risk of the transfer of the die attach film 41 to the semiconductor chip 42.

Further, a downward dented space can be formed by the low-level surface region 73*a* where the PI film 84*a* is not provided and the PI film 84*a*. Thereby, it is possible to keep the die attach film 41*b* in the space, and therefore, compared to the semiconductor device 90 (see FIG. 8), it is possible to reduce the interval between the semiconductor chips 42, and further to reduce the total height of the chip laminated body 40.

Further, compared to the first embodiment, the contact area between the PI film 84*a* and the die attach film 41*b* is increased by the downward dented space formed by the low-level surface region 73*a* where the PI film 84*a* is not provided and the PI film 84*a*. Accordingly, the adhesion strength between the semiconductor chip 42*a* and the semiconductor chip 42*b* is improved.

First Modification

Figure 11:
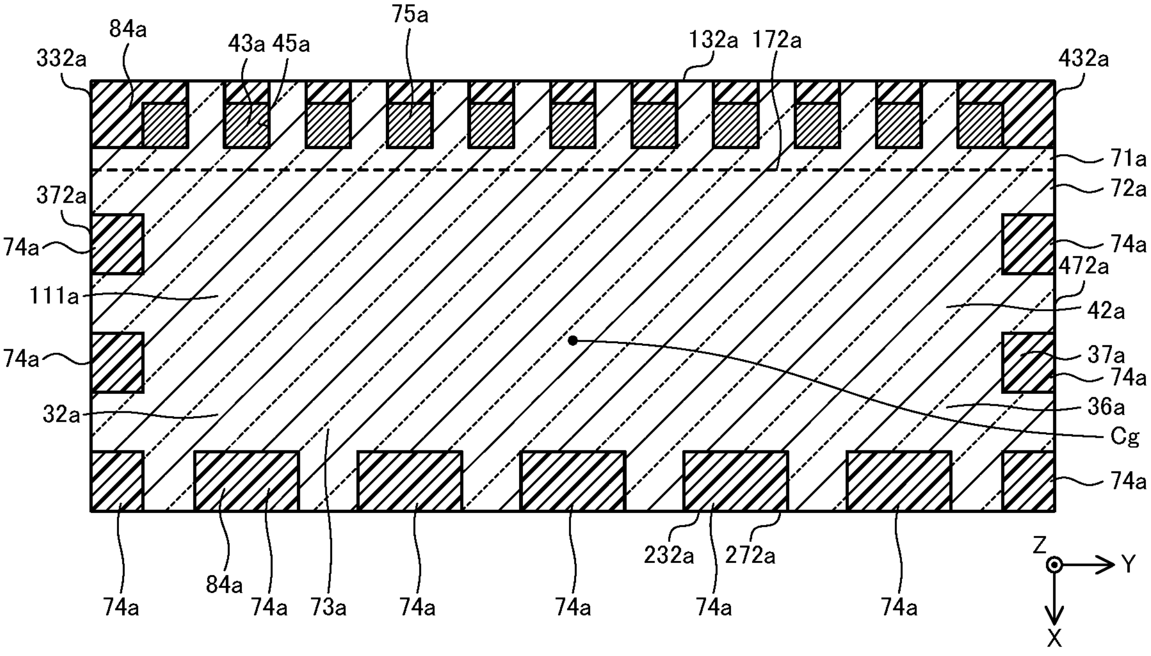
FIG. 11 is a plan view of a semiconductor chip according to a first modification of the second embodiment as viewed from above.

FIG. 11 is a plan view of a semiconductor chip according to a first modification of the second embodiment as viewed from above. As shown in FIG. 11, in the semiconductor chip 42*a* according to the first modification of the second embodiment, the low-level surface region 73*a* contacts with the sides 132*a*, 232*a*, 332*a*, and 432*a* of the plane 32*a*, in planar view of the plane 32*a*. The high-level surface region 74*a* is divided into a plurality of regions. That is, as shown in FIG. 11, the low-level surface region 73*a* is positioned between two high-level surface regions 74*a*.

Accordingly, even if the void is generated in the die attach film 41*b* when the semiconductor chip 42*b* is placed on the semiconductor chip 42*a*, it is possible to push the void out of the die attach film 41*b* through between the two high-level surface regions 74*a*.

Second Modification

Figure 12:
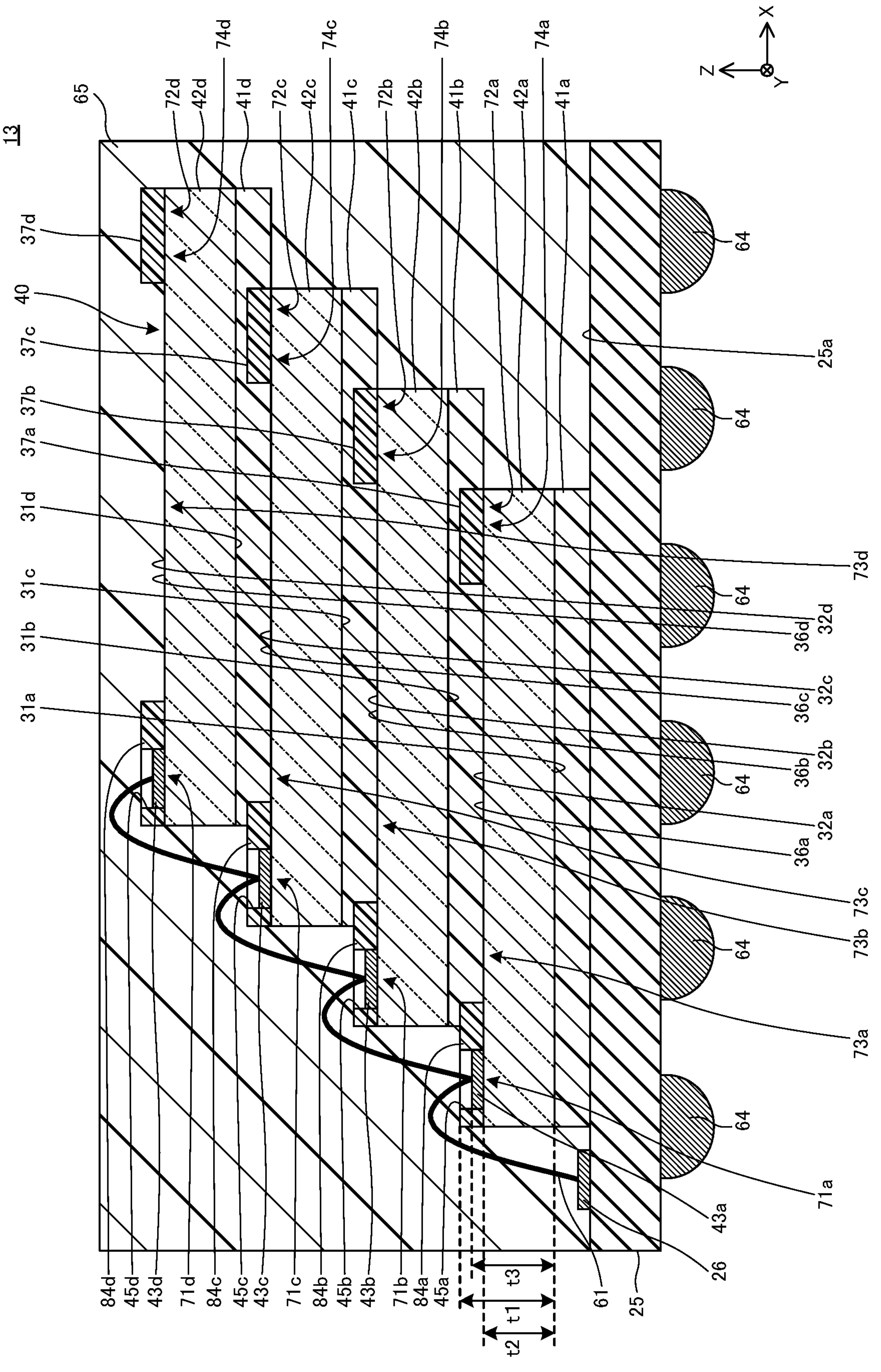
FIG. 12 is a schematic view showing a cross-section of a semiconductor device according to a second modification of the second embodiment as viewed laterally.

FIG. 12 is a schematic view showing a cross-section of a semiconductor device according to a second modification of the second embodiment as viewed laterally. The configuration in which the upper high-level surface 37*a* of the PI film 84*a* and the lower plane 31*b* of the semiconductor chip 42*b* contact with each other in the semiconductor device 12 shown in FIG. 6 has been described, but the present disclosure is not limited to this.

As shown in FIG. 12, in the semiconductor device 13, the die attach film 41*b* is provided between the upper high-level surface 37*a* of the PI film 84*a* and the lower plane 31*b* of the semiconductor chip 42*b*. Similarly, the die attach film 41*c* is provided between the upper high-level surface 37*b* of the PI film 84*b* and the lower plane 31*c* of the semiconductor chip 42*c*. Similarly, the die attach film 41*d* is provided between the upper high-level surface 37*c* of the PI film 84*c* and the lower plane 31*d* of the semiconductor chip 42*d*.

The semiconductor devices 12 and 13 are example, and for example, it is allowable to mix the configuration in which the upper high-level surface of the PI film and the lower plane of the semiconductor chip contact with each other and the configuration in which the die attach film is provided between the upper high-level surface of the PI film and the lower plane of the semiconductor chip.

Third Modification

Figure 13:
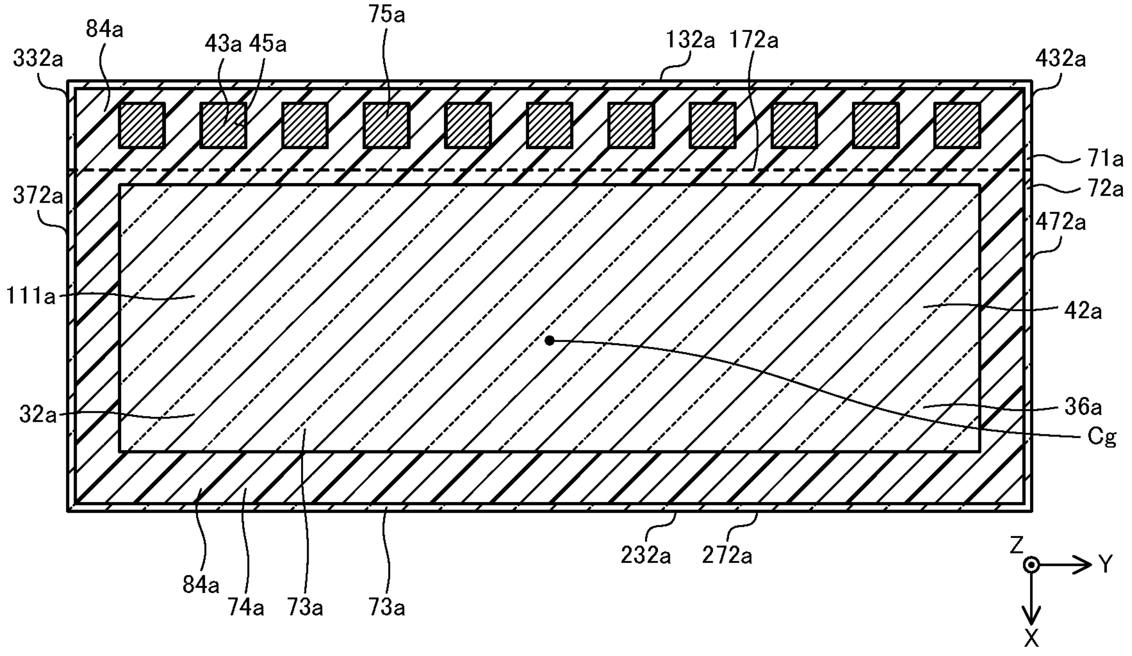
FIG. 13 is a plan view of a semiconductor chip according to a third modification of the second embodiment as viewed from above.

FIG. 13 is a plan view of a semiconductor chip according to a third modification of the second embodiment as viewed from above. The configuration in which the high-level surface region 74*a* contacts with the sides 132*a*, 232*a*, 332*a*, and 432*a* of the plane 32*a* in planar view of the plane 32*a* in the semiconductor device 12 shown in FIG. 6 and FIG. 7 has been described, but the present disclosure is not limited to this.

It is allowable to adopt a configuration in which the high-level surface region 74*a* does not contacts with the sides 132*a*, 232*a*, 332*a*, and 432*a* of the plane 32*a* in planar view of the plane 32*a*, as shown in FIG. 13. In the modification, the low-level surface 36*a* is positioned between the outer circumference of the high-level surface region 74*a* and the outer circumference of the plane 32*a*. It is allowable to adopt a configuration in which the high-level surface region 74*a* contacts with a part of the sides 132*a*, 232*a*, 332*a*, and 432*a* of the plane 32*a* in planar view of the plane 32*a*.

Fourth Embodiment

Figure 14:
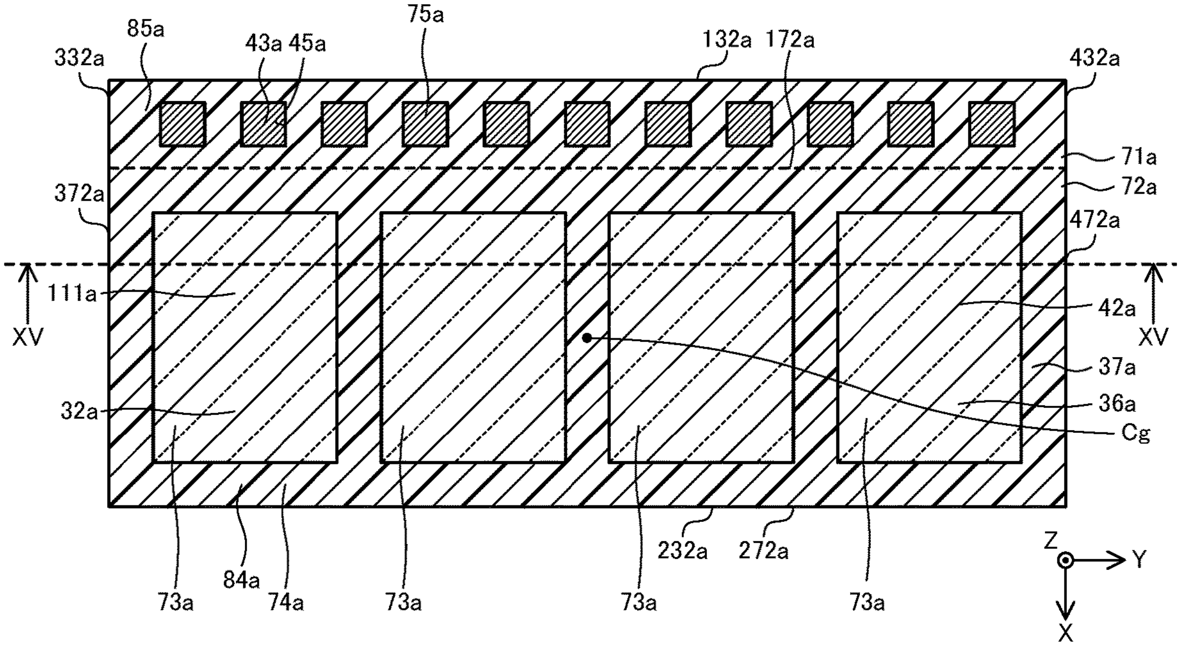
FIG. 14 is a plan view of a semiconductor chip according to a fourth modification of the second embodiment as viewed from above.

FIG. 14 is a plan view of a semiconductor chip according to a fourth modification of the second embodiment as viewed from above. The configuration in which the low-level surface region 73*a* is not divided in the semiconductor device 12 shown in FIG. 6 and FIG. 7 has been described, but the present disclosure is not limited to this.

As shown in FIG. 14, in the semiconductor chip 42*a* according to the fourth modification of the second embodiment, the low-level surface region 73*a* is divided into four regions. The low-level surface region 73*a* may be divided into two regions, three regions, or five or more regions.

The low-level surface region 73*a* shown in FIG. 14 does not include the gravity center Cg of the chip arrangement region 72*a*. It is allowable to adopt a configuration in which the low-level surface region 73*a* includes the gravity center Cg.

Among the four low-level surface regions 73*a*, the low-level surface region 73*a* positioned on the outermost side in the Y-axis−direction is provided, for example, at a position 150 μm or more away from the side 332*a* of the semiconductor chip 42*a* in the Y-axis+direction. The low-level surface region 73*a* positioned on the outermost side in the Y-axis+direction is provided, for example, at a position 150 μm or more away from the side 432*a* of the semiconductor chip 42*a* in the Y-axis−direction.

The four low-level surface regions 73*a* are provided, for example, at a position 150 μm or more away from the side 232*a* of the semiconductor chip 42*a* in the X-axis−direction. The four low-level surface regions 73*a* are provided, for example, at a position 150 μm or more away from the edge 172*a* of the chip arrangement region 72*a* in the X-axis+ direction. The four low-level surface regions 73*a* are provided, for example, at a position 1 mm away from the chip electrodes 43*a* in the X-axis+direction.

For example, the four low-level surface regions 73*a* are formed by the photolithography processing described in FIG. 5B. For example, the four low-level surface regions 73a may be formed by a dicing for which the blade 103 shown in FIG. 5E is used. For example, this dicing is performed before the separation into a plurality of semiconductor chips 42 (S110).

Figure 15:
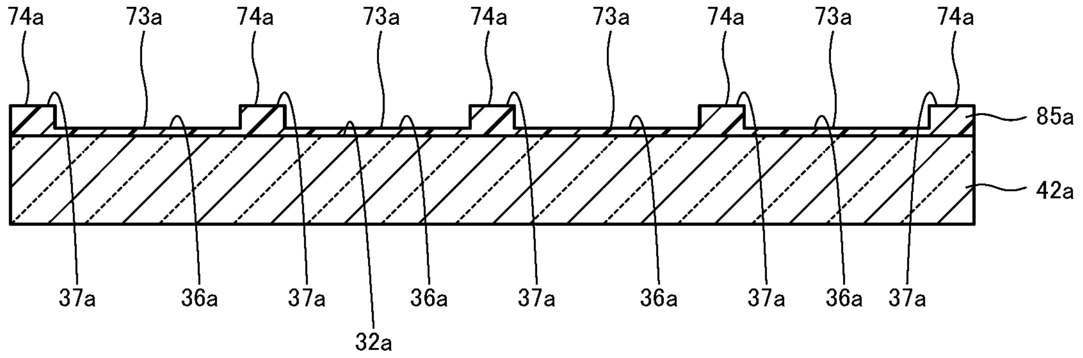
FIG. 15 is a cross-section view along cutting-plane line XV-XV shown in FIG. 14.

FIG. 15 is a cross-section view along cutting-plane line XV-XV shown in FIG. 14. The configuration in which the plane 32a is exposed at the opening of the PI film 85a has been described, but the present disclosure is not limited to this. It is allowable to adopt a configuration in which the PI film 85a is not opened at the low-level surface region 73a and the PI film 85a having a low-level surface 36a lower than the high-level surface 37a of the PI film 85a at the high-level surface region 74a is arranged at the low-level surface region 73a as shown in FIG. 15.

Figure 16:
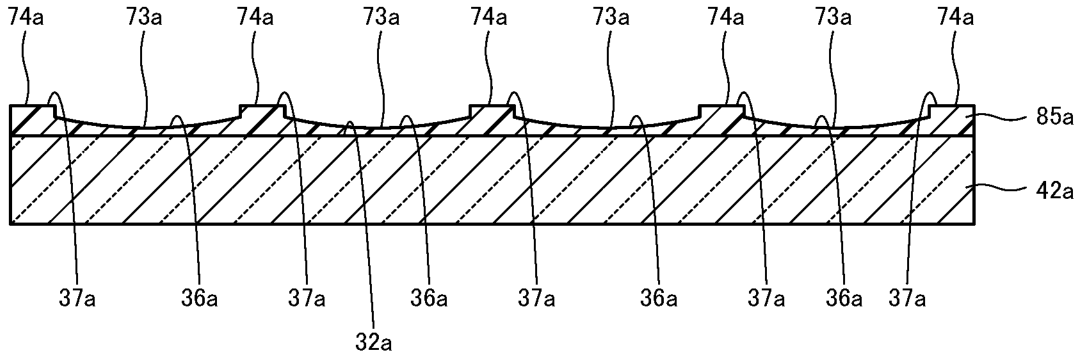
FIG. 16 is a cross-section view along cutting-plane line XV-XV shown in FIG. 14.

It is allowable to adopt a configuration in which the low-level surface 36a has a round shape that is dented downward, as shown in FIG. 16.

Figure 17:
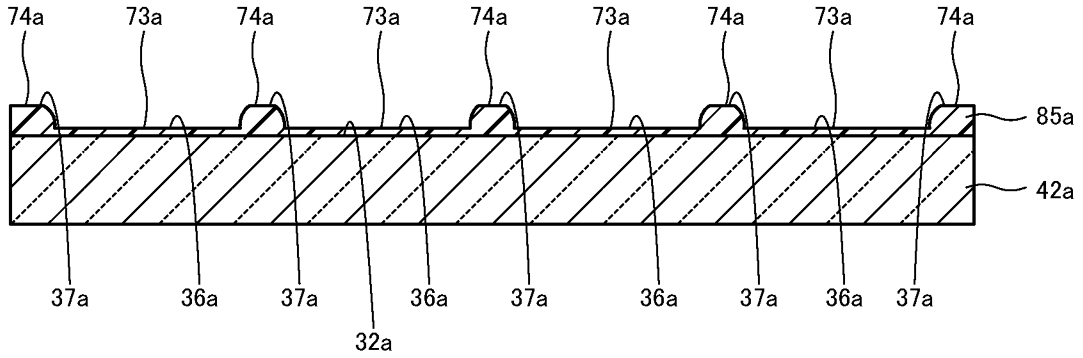
FIG. 17 is a cross-section view along cutting-plane line XV-XV shown in FIG. 14.

It is allowable to adopt a configuration in which round chamfering is performed to the step between the high-level surface 37a and the low-level surface 36a, as shown in FIG. 17.

Figure 18:
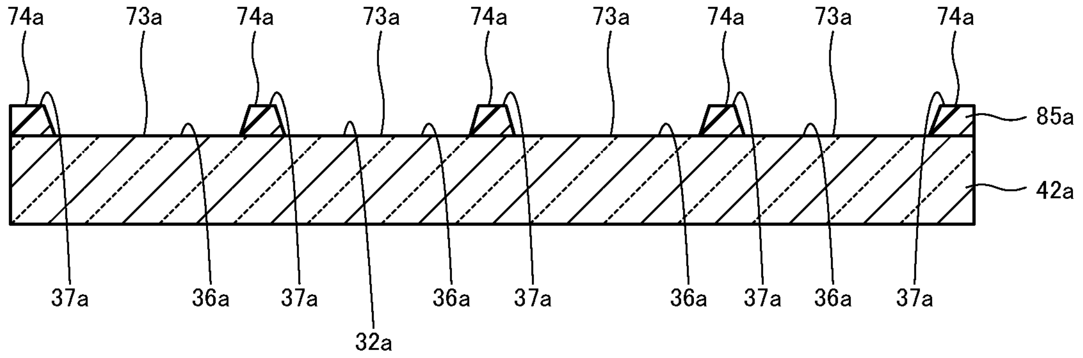
FIG. 18 is a cross-section view along cutting-plane line XV-XV shown in FIG. 14.

It is allowable to adopt a configuration in which C chamfering is performed to the step between the high-level surface 37a and the low-level surface 36a, as shown in FIG. 18. In the semiconductor chip 42a shown in FIG. 18, the PI film 85a is opened and the plane 32a is exposed, at the low-level surface region 73a.

(a) In the embodiment, the configuration in which the Pi film 44 at the lamination region 34 is fully removed has been described, but the present disclosure is not limited to this. For example, it is allowable to adopt a configuration in which the PI film 44 lower than the PI film 44a at the bonding region 33a is arranged at the lamination region 34a in the semiconductor chip 42a. In other words, it is allowable to adopt a configuration in which the PI film 44 having a thickness smaller than the thickness of the PI film 44a at the bonding region 33a is arranged at the lamination region 34a.

(b) In the embodiment, the configuration in which the chip laminated body 40 is arranged on the wiring substrate 25 has been described, but the present disclosure is limited to this. It is allowable to adopt a configuration in which the chip laminated body 40 is arranged on or above a lead frame.

Figure 19:
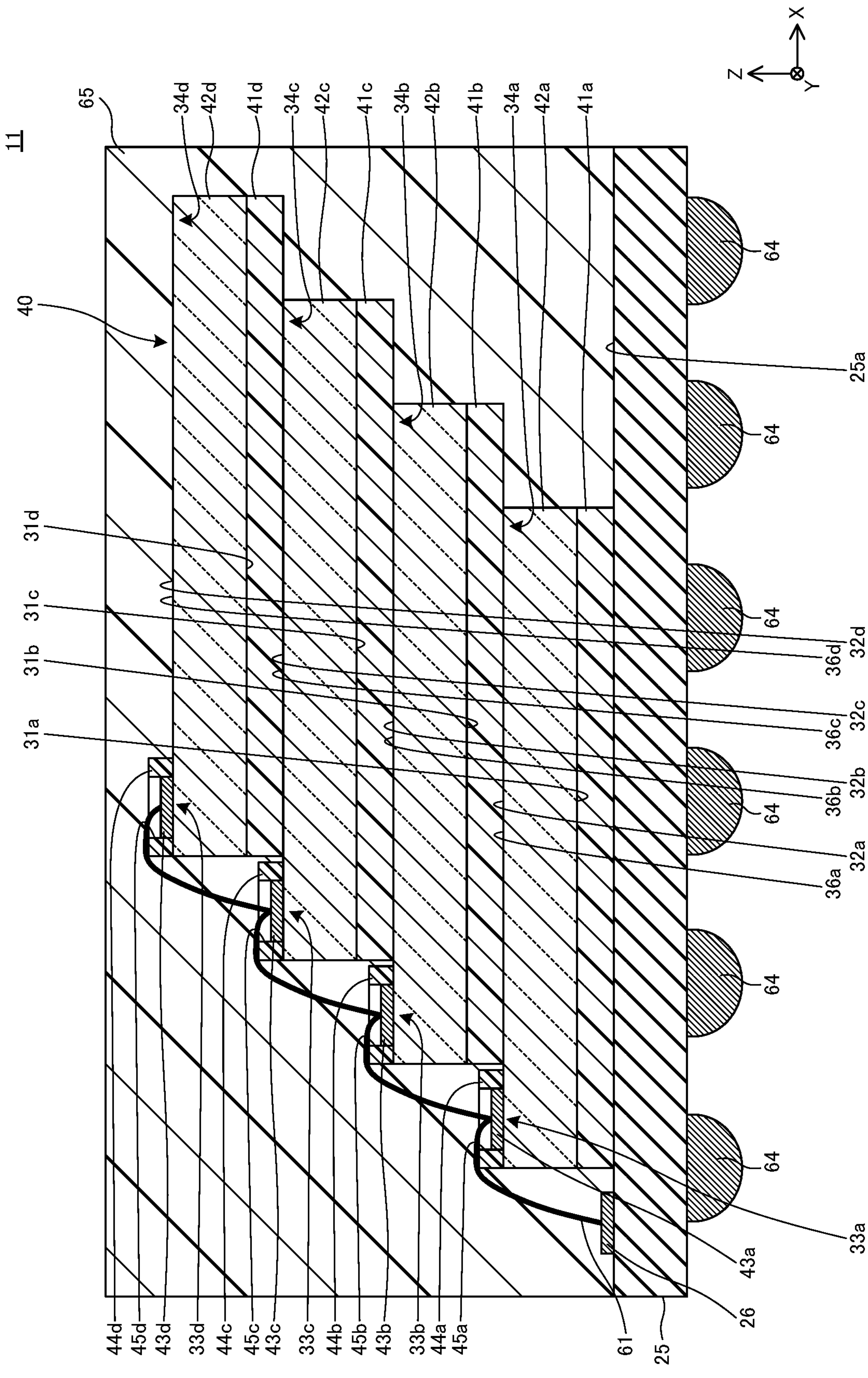
FIG. 19 is a schematic view showing a cross-section of a semiconductor device according to a modification as viewed laterally.

(c) In the embodiment, the configuration in which the bonding wires 61 do not abut on the PI films 44a, 44b, 44c, and 44d has been described, but the present disclosure is not limited to this. It is allowable to adopt a configuration in which the bonding wires 61 abut on the PI films 44a, 44b, 44c, and 44d, as in the case of a semiconductor device 11 (an example of the "semiconductor memory device") shown in FIG. 19, which is a modification of the semiconductor device 10. It is allowable to adopt a configuration in which the bonding wires 61 abut on parts of the PI films 44a, 44b, 44c, and 44d.

(d) In the embodiment, the configuration in which the four semiconductor chips 42 are laminated in the chip laminated body 40 has been described, but the present disclosure is not limited to this. It is allowable to adopt a configuration in which two semiconductor chips 42, three semiconductor chips 42, or five or more semiconductor chips 42 are laminated in the chip laminated body 40.

(e) In the embodiment, the configuration in which the solder balls 64 are arranged on the lower plane of the wiring substrate 25 has been described, but the present disclosure is not limited to this. It is allowable to adopt a configuration in which the lower plane of the wiring substrate 25 has an LGA (Land Grid Array) in which plane electrode pads are arrayed in a reticular pattern.

(f) A semiconductor device according to the present disclosure includes:
- a substrate that includes an external terminal;
- a first semiconductor chip on or above which a first bonding pad is arranged;
- a second semiconductor chip that is arranged between the substrate and the first semiconductor chip, the second semiconductor chip on or above which a second bonding pad and a first insulating film being arranged;
- a bonding wire that connects the substrate, the first bonding pad, and the second bonding pad; and
- a sealing resin that seals at least the first semiconductor chip, the second semiconductor chip, and the bonding wire, wherein:
- the second semiconductor chip includes a smooth first surface that faces the substrate, and a second surface that faces the first semiconductor chip; and
- the second surface includes
  - a first bonding region where the second bonding pad and the first insulating film are arranged, and
  - a first lamination region that is thinner than the thickness of the second semiconductor chip including the first insulating film, the first semiconductor chip being arranged at at least a part of the first lamination region.

(g) A semiconductor device according to the present disclosure is a semiconductor device including:
- a substrate that includes an external terminal;
- a first semiconductor chip; and
- a second semiconductor chip that is arranged between the substrate and the first semiconductor chip, the second semiconductor chip on or above which a first insulating film being arranged, wherein:
- the second semiconductor chip includes a first surface that faces the substrate, and a second surface on an opposite side of the first surface;
- the second surface includes
  - a first chip arrangement region where the first semiconductor chip is arranged,
  - a high-level surface region that includes a high-level surface, at least a part of the high-level surface region overlapping with the first chip arrangement region, and
  - a low-level surface region that is adjacent to the high-level surface region and that includes a third low-level surface lower than the high-level surface, at least a part of the low-level surface region overlapping with the first chip arrangement region; and
- the first insulating film is arranged at least at the high-level surface region.

(h) The semiconductor device according to (g), wherein the low-level surface region includes a gravity center of the first chip arrangement region.

(i) The semiconductor device according to (h), wherein the high-level surface region is positioned that being closer to an edge of the first chip arrangement region than to the gravity center.

(j) The semiconductor device according to (g), wherein the low-level surface region contacts with an edge of the second surface.

(k) The semiconductor device according to (i), wherein the high-level surface region is divided into a plurality of regions.

(l) The semiconductor device according to (g), wherein the high-level surface region contacts with an edge of the second surface in planar view of the second surface.

(m) The semiconductor device according to (g), wherein the low-level surface region is divided into a plurality of regions.

(n) The semiconductor device according to (g), wherein;

a first bonding pad is arranged on or above the first semiconductor chip;

an adjacent region that is adjacent to the first chip arrangement region includes a second bonding pad and the first insulating film; and the semiconductor device further comprises a bonding wire that connects the substrate, the first bonding pad, and the second bonding pad, and a sealing resin that seals at least the first semiconductor chip, the second semiconductor chip, and the bonding wire.

(o) The semiconductor device according to (g), wherein the surface of the first insulating film is formed so as to be higher than a surface of the second bonding pad.

(p) The semiconductor device according to (g), wherein:

the first semiconductor chip includes a third surface that faces the substrate across the second semiconductor chip; and the semiconductor device further comprises an adhesion layer that performs adhesion between at least a part of the low-level surface region on the second surface and at least a part of the third surface.

(q) The semiconductor device according to (g), wherein:

a second insulating film is further arranged on or above the first semiconductor chip;

the first semiconductor chip includes a third surface that faces the substrate across the second semiconductor chip, and a fourth surface on an opposite side of the third surface; and the fourth surface includes a second chip arrangement region where a third semiconductor chip is arranged, a high-level surface region that includes a high-level surface, at least a part of the high-level surface region overlapping with the second chip arrangement region, and a low-level surface region that is adjacent to the high-level surface region and that has a fourth low-level surface formed that being lower than the high-level surface, at least a part of the low-level surface region overlapping with the second chip arrangement region; and the second insulating film is arranged at least at the high-level surface region.

The embodiments have been described above with reference to specific examples. The present disclosure is not limited to the specific examples. Examples in which a person skilled in the art appropriately has performed design change to the specific examples are also included in the scope of the present disclosure, as long as the characteristics of the present disclosure are included. The elements included in the above specific examples, the dispositions thereof, the conditions thereof, the shapes thereof, and the like are not limited to those in the examples, and can be appropriately changed. The combinations of the elements included in the above specific examples can be appropriately changed, as long as there is no technical inconsistency.

What is claimed is:

1. A semiconductor device comprising:

a substrate that includes an external terminal;

a first semiconductor chip on or above which a first bonding pad is arranged;

a second semiconductor chip that is arranged between the substrate and the first semiconductor chip, the second semiconductor chip on or above which a second bonding pad and a first insulating film being arranged;

a bonding wire that connects the substrate, the first bonding pad, and the second bonding pad; and a sealing resin that seals at least the first semiconductor chip, the second semiconductor chip, and the bonding wire, wherein:

the second semiconductor chip includes a first surface that faces the substrate, and a second surface on an opposite side of the first surface; and the second surface includes a first bonding region where the second bonding pad and the first insulating film are arranged, and a first lamination region that has a first low-level surface formed that being lower than a surface of the first insulating film, the first semiconductor chip being arranged on or above at least a part of the first low-level surface.

2. The semiconductor device according to claim 1, wherein the surface of the first insulating film is formed that being higher than a surface of the second bonding pad.

3. The semiconductor device according to claim 1, wherein:

the first semiconductor chip includes a third surface that faces the substrate across the second semiconductor chip; and the semiconductor device further comprises an adhesion layer that performs adhesion between at least a part of the first lamination region on the second surface and at least a part of the third surface.

4. The semiconductor device according to claim 1, wherein:

a second insulating film is further arranged on or above the first semiconductor chip;

the first semiconductor chip includes a third surface that faces the substrate across the second semiconductor chip, and a fourth surface on an opposite side of the third surface; and the fourth surface includes a second bonding region where the first bonding pad and the second insulating film are arranged, and a second lamination region that has a second low-level surface formed that being lower than a surface of the second insulating film, a third semiconductor chip being arranged on or above at least a part of the second low-level surface.

5. The semiconductor device according to claim 1, wherein:

the second surface has a rectangular shape; and the first bonding region is positioned that being closer to one side of two facing sides of the rectangular shape than to the other side.

6. The semiconductor device according to claim 5, wherein the first bonding region abuts on the one side.

* * * * *